US008514031B2

(12) United States Patent
Popelka et al.

(10) Patent No.: US 8,514,031 B2
(45) Date of Patent: Aug. 20, 2013

(54) INTEGRATED CIRCULATORS SHARING A CONTINUOUS CIRCUIT

(75) Inventors: David J. Popelka, Alpharetta, GA (US); Todd Vaughn, Lawrenceville, GA (US); John D. Voss, Cumming, GA (US)

(73) Assignee: EMS Technologies, Inc., Norcross, GA (US)

(*) Notice: Subject to any disclaimer, the term of this patent is extended or adjusted under 35 U.S.C. 154(b) by 94 days.

(21) Appl. No.: 13/024,986

(22) Filed: Feb. 10, 2011

(65) Prior Publication Data

US 2011/0193649 A1 Aug. 11, 2011

Related U.S. Application Data

(63) Continuation-in-part of application No. 11/314,160, filed on Dec. 19, 2005, now Pat. No. 7,907,030.

(60) Provisional application No. 60/636,945, filed on Dec. 17, 2004.

(51) Int. Cl.
*H01P 1/387* (2006.01)

(52) U.S. Cl.
USPC .......................................... 333/1.1; 333/24.2

(58) Field of Classification Search
USPC ................................................. 333/24.2, 1.1
See application file for complete search history.

(56) References Cited

U.S. PATENT DOCUMENTS

| | | | |
|---|---|---|---|
| 3,334,317 | A | 8/1967 | Andre |
| 3,636,479 | A | 1/1972 | Hartz et al. |
| 3,739,302 | A | 6/1973 | McManus |
| 3,854,106 | A | 12/1974 | Tresselt |
| 4,761,621 | A | 8/1988 | Kane et al. |
| 4,821,007 | A | 4/1989 | Fields et al. |
| 5,177,456 | A | 1/1993 | Stern et al. |
| H1408 | H | 1/1995 | Babbitt et al. |
| 5,886,587 | A | 3/1999 | Sturdivant |
| 6,563,394 | B1 | 5/2003 | Kudo |
| 6,566,972 | B2 | 5/2003 | Paquette et al. |

(Continued)

FOREIGN PATENT DOCUMENTS

| | | |
|---|---|---|
| EP | 1816702 | 8/2007 |
| JP | 59008403 | 1/1984 |

(Continued)

OTHER PUBLICATIONS

European Patent Office, "Office Action", Jun. 5, 2012, Published in: EP.

(Continued)

*Primary Examiner* — Stephen Jones
(74) *Attorney, Agent, or Firm* — Fogg & Powers LLC

(57) ABSTRACT

The present invention is directed to a circuit assembly that includes an integrated circulator assembly. The circuit assembly has a first substrate, which contains a continuous circuit trace that includes a circulator component from the circulator assembly and at least one electrical component from the circuit assembly. A second substrate is disposed beneath the first substrate and includes a cladding on one surface. The second substrate contains an aperture that accepts a ferrite element, which is axially aligned with the circulator component of the circuit trace. A conductive material is placed across the ferrite element so that it forms a continuous ground plane with the cladding, which is common to the entire circuit trace. The circulator assembly also contains a magnet bonded to the ferrite element. The circulator assembly may also include a yoke disposed below the magnet to shield the circulator from external magnetic fields.

13 Claims, 16 Drawing Sheets

(56) References Cited

U.S. PATENT DOCUMENTS

| | | | |
|---|---|---|---|
| 6,611,180 | B1 | 8/2003 | Puzella et al. |
| 6,633,205 | B2 | 10/2003 | Jussaume et al. |
| 6,707,417 | B2 | 3/2004 | Huettner et al. |
| 6,741,478 | B2 | 5/2004 | Shimizu et al. |
| 6,750,731 | B2 | 6/2004 | Emanuelsson |
| 6,822,524 | B2 | 11/2004 | Hempel et al. |
| 6,914,496 | B2 | 7/2005 | Tanaka |
| 6,917,250 | B2 | 7/2005 | Lombardi et al. |
| 7,907,030 | B2 | 3/2011 | Vaughn et al. |
| 2002/0089388 | A1 | 7/2002 | Lingel et al. |
| 2004/0000958 | A1 | 1/2004 | Lingel |
| 2004/0145424 | A1 | 7/2004 | Jocher |
| 2005/0007206 | A1 | 1/2005 | Kocharyan |
| 2005/0093641 | A1 | 5/2005 | Lombardi et al. |
| 2005/0110591 | A1 | 5/2005 | Martin et al. |
| 2006/0139118 | A1 | 6/2006 | Vaughn et al. |

FOREIGN PATENT DOCUMENTS

| | | |
|---|---|---|
| JP | 08204408 | 9/1996 |
| JP | 2000201007 | 7/2000 |
| WO | 2006066254 | 6/2006 |

OTHER PUBLICATIONS

European Patent Office, “European Search Report”, mailed May 25, 2012, Published in: EP.

WIPO PCT Search Report conducted by and Written Opinion prepared by the European Patent Office for PCT Application No. PCT/US2005/046164 dated Apr. 20, 2006.

609
633
636
606
648
657
509
642
8
8
9
9

INTEGRATED CIRCULATORS SHARING A CONTINUOUS CIRCUIT

REFERENCE TO RELATED APPLICATIONS

This application is a continuation-in-part of U.S. patent application Ser. No. 11/314,160 of the same title filed 19 Dec. 2005, which claims priority to U.S. Provisional Patent Application Ser. No. 60/636,945, filed on Dec. 17, 2004. Both Applications are incorporated herein by reference as if fully set forth below.

BACKGROUND

1. Field of the Invention

Embodiments of the present invention relate to a device, system, and method for providing continuous circuit traces, and specifically to a device, system, and method for providing continuous circuit traces comprising circulators and other electronic components in a continuous circuit trace, obviating the need for manual interconnects and impedance matching.

2. Description of the Related Art

The use of circulators to isolate and transmit electronic signals is well known. Circulators are multi-port devices, which receive a radio frequency (RF) signals on one port and route them to an adjacent port while isolating or decoupling the RF signal from the remaining ports. Currently, circulators are used for applications that operate at very high frequencies. For example, circulators are commonly used in microwave circuits and microwave transmit and receive (T/R) modules for both RADAR and communications systems. Conventional circulator designs may include a y-shaped RF conductor with three port connectors that are positioned between a pair of ferrite substrates. Magnets are placed above and below the ferrite substrates to produce a DC-biasing magnetic field in the ferrite elements to provide non-reciprocal operation of the transmission paths between the three port connectors. A thin metal plate, or cladding, is placed on the outer surface of each ferrite substrate below each magnet to provide ground planes for the circulator and provide shielding from spurious RF radiation. The components are then placed within a steel case or housing to hold provided a return path for the magnetic fields generated by the magnets, while at the same time shielding the components from extraneous magnetic fields.

Although circulators are extremely efficient devices, conventional circulators have several drawbacks. First, installation of conventional circulators on a circuit board requires that an aperture, which is slightly larger than the circulator package is cut into the circuit board where the circulator is to be installed. The circulator is then placed within the aperture and the port connectors are attached to the external circuit trace on the circuit board using manual interconnection, such as solder, ribbon cables, and the like.

As shown in FIG. 1*a*, from U.S. Pat. No. 4,761,621 to Kane ("Kane"), printed circuit circulators are known in the art. Conventionally, however, even those circulators manufactured as printed circuit components have nonetheless been connected to other external electronic components (e.g., resistors, filters, additional circulators) using traditional methods. In other words, the external components are surface mounted or through hole mounted and then soldered to the printed circuit board ("PCB"). As a result, since the port leads 313, 401, 403 of the circulator are normally made from different materials and have different impendence values from the external components 407, 409, 413, and because these components 407, 409, 413 are soldered to the board, there is an impedance mismatch at the interconnects, which results in a degradation of the electrical performance of the circulator.

The impedance mismatch must be corrected using ribbon connectors, or other known methods to match the impedance the port connectors with the circuit trace. As shown in FIG. 1*b*, from U.S. Pat. No. 3,334,317 to Andre ("Andre"), attempts to correct this impedance mismatch include using multiple stepped impedance matching sections 10*b*, 10*c* to perform a conventional impedance transformation. This adds complexity to the manufacturing process and requires tuning based on the operational frequency range of the circulator. In other words, two resonators operating at two different frequencies require impedance matching sections 10*b*, 10*c* that are different sizes (i.e., widths) based on their frequency.

Additionally, discontinuities between the circulator and the circuit trace exist at the connection ports. The manual interconnects also lead to insertion losses at the port connectors, an increase in the interference from unwanted RF signals, and high performance variability of the circulator. Furthermore, the manual interconnects tend to have poor thermal capabilities, which can lead to a decrease in the amount of signal power that can be passed through the circuit.

Another drawback with conventional circulators is that the circulators do not lie within the same plane as the components of the external circuit. This makes it difficult to effectively provide a common ground the circulator and the circuit. Typically a metal plate must be molded to conform to the contours created by the circulator and adhered to the backside of both the circulator and the external circuit. This non-planar ground plane can lead to reduction in the electrical performance of the circulator.

Yet another drawback to conventional circulators is that they are expensive to manufacture and cannot be made using an automated manufacturing process. For example, the ferrite substrates used in conventional circulators tend to be brittle and can be damaged in an automated manufacturing process. In addition, the components, particularly the resonator, the ferrite elements, and the magnets must be precisely aligned to insure proper operation of the circulator. Consequently, all or at least part of conventional circulators must be assembled manually and the component aligned using a jig or and aligning frame. Once the components are properly aligned, they are sealed, usually by hand, in a steel housing. A spring or other compression mechanism is usually placed in the housing to insure that the ferrite material remains in constant contact with the resonator. Unfortunately, this assembly process is expensive in both time and money.

Several attempts have been made to solve these problems associated with conventional circulators. For example, one method attempted to reduce impedance mismatch between two or more circulator by cascading the circulators in a common package. The circulator includes two or more RF conductors cascaded together, which are disposed between two oblong ferrite substrates. A single impedance matching element is coupled between the coupled connection ports of the cascaded circulator resonators to improve the performance of the circulators. Unfortunately this method still must use manual interconnects to connect the cascaded circulators to an exterior circuit. Furthermore, the circulator elements are disposed between two ferrite substrates, which are easily damaged.

Another solution was to design a cost effective method of manufacturing a large number of circulators. The method includes depositing a circulator trace on a central dielectric substrate. A series of dielectric shims, which are pre-drilled with an opening are disposed around a ferrite element, which rests on top each side of the central substrate. A steel plate is then placed on each side of the substrate layer. An outer shim then is placed on top of the steel disc. The outer shim contains a number of vias etched down to the steel plate to provide an electrical contact to ground. A number of vias are then drilled into the outer shim and filled with a conductive material to provide contacts for surface mounting the circulator to a circuit board. Although the method uses inexpensive materials, this circulator has several drawbacks. First, the steel disc covers only a portion of the circulator trace, which provides an inadequate ground for the circulator trace and consequently does not adequately shield the circulator trace from spurious RF signals. Furthermore, since the circulator is designed for surface mounting, the circulator does not lie in-line with the external circuit and therefore, the ground plane of the circuit is non-planar and discontinuous. The ground plane between the external circuit and the circulator must be bridged with ribbon cables, or other suitable connectors, which results in electrical inefficiencies. Moreover, since the circulator is surface mounted, it uses manual interconnects to connect the circulator to the external circuit, which result in an impedance mismatch between the circulator and the external circuit.

Therefore, there is a need in the art for a low cost circulator that uses standard dielectric materials that can be assembled using conventional PCB techniques. There is a further need in the art for a circulator that can be integrated into a circuit, in which the circuit trace of the circulator and the trace of the electrical circuit are part of the same continuous circuit trace without the use of manual interconnects. There is still a further need for a circulator that has a continuous ground plane and can be inserted into a circuit board so that the circulator trace is in-line with the trace of the components from the external circuit.

SUMMARY

Embodiments of the present invention relate to a device, system, and method for creating a continuous circuit trace comprising one or more circulators and one or more external electronic components. The ability to manufacture these components in a continuous circuit trace eliminated impedance mismatches created between the components. This, in turn, eliminates the need for physical impedance matching using, for example, variable width impedance matching sections between the components and the adjacent circuitry and traces. This technology enables low cost printed circuit board ("PCB") manufacturing of circulators and overcomes the performance loss normally associated with printed circulators in the PCB environment.

Embodiments of the present invention can include device comprising a first substrate and a continuous circuit trace printed on the first substrate, the continuous circuit trace comprising a first circulator pattern and a first external component. The circulator pattern can comprise a central conductor element and three or more connection ports. In some embodiments, the circulator pattern can further comprise a discontinuous ring disposed around the central conductor element to improve circulator loading. In other embodiments, the central conductor element can comprise one or more slots to improve circulator loading.

The first external component can comprise a variety of RF electronic components. The RF electronic component can comprise, for example and not limitation, a second circulator pattern, a filter, an antenna, a power divider, or a power combiner. In some embodiments, the circuit can further comprise a second external component in a continuous circuit trace with the first circulator pattern and the first external component. To improve circulator performance, the first substrate can be relatively thin. In some embodiments, the thickness of the first substrate is between approximately 0.001 and 0.010 inches.

In some embodiments, the device can further comprise a second substrate disposed beneath the first substrate. The second substrate can comprise, for example, a cladding on a first side, an aperture, and a ferrite element inserted into the aperture and proximately aligned with the central conductor element. In some embodiments, a conductive material can be disposed over the ferrite element in electrical contact with the cladding to form a continuous ground plane. A first magnet can also be disposed below the ferrite element.

Embodiments of the present invention can also comprise a first substrate, a first continuous circuit trace printed on the first side of the first substrate, the first continuous circuit trace comprising a first circulator pattern and a first external component, and a second continuous circuit trace printed on the second side of the first substrate, the second continuous circuit trace comprising at least a second circulator pattern. As above, the first and second circulators each can comprise a central conductor element and three or more connection ports. In some embodiments, the first circulator and the second circulator can be connected with conductive vias in the first substrate.

Embodiments of the present invention can further comprise a second substrate disposed beneath the first substrate. The second substrate can comprise a cladding on a first side, a first aperture, and a first ferrite element inserted into the first aperture and proximately aligned with the central conductor elements. A conductive material can be disposed over the first ferrite element and in electrical contact with the cladding on the first side of the second substrate and can form a continuous ground plane. In some embodiments, a first magnet can be disposed below the first ferrite element.

The thickness of the first substrate can be between approximately 0.001 and 0.010 inches. The thickness of the second substrate can be between approximately 0.01 and 0.07 inches. In a preferred embodiment, the conductive material comprises a conductive thin film adhesive. In some embodiments, the second continuous circuit trace printed on the second side of the first substrate can comprise the second circulator pattern and a second external component.

In some embodiments, a third substrate can be disposed above the first substrate. The third substrate can comprise a cladding on a first side, a second aperture, and a second ferrite element. The second ferrite element can be inserted into the second aperture and can be proximately aligned with the central conductor elements. In a preferred embodiment, a conductive material can be disposed over the second ferrite element such that it is in electrical contact with the cladding on the first side of the third substrate to form a continuous ground plane. The device can further comprise a second magnet, which can be disposed above the second ferrite element.

Still other embodiments of the present invention can comprise a method for creating an integrated circuit comprising providing a first substrate and printing a continuous circuit on the first side of the first substrate comprising a first circulator pattern and a first external component.

The method can further comprise providing a second substrate comprising a metalized layer on at least one side and creating a first aperture in the second substrate sized and shaped to accept a first ferrite disk. The first ferrite disk can be inserted into the aperture and a conductive material can be placed over the first ferrite disk such that the conductive material is in electrical contact with the first ferrite disk and the metalized layer on the second substrate to form a continuous ground plane. A first magnet can be placed below the first ferrite disk and the second substrate can be bonded to the bottom of the first substrate.

Embodiments of the present invention can further comprise providing a third substrate comprising a metalized layer on at least one side. A second aperture can be created in the third substrate sized and shaped to accept a second ferrite disk. The second ferrite disk can be inserted into the aperture and a conductive material can be placed over the ferrite disk such that the conductive material is in electrical contact with the first ferrite disk and the metalized layer on the third substrate to form a continuous ground plane. In some embodiments, a second magnet can be placed above the second ferrite disk. The third substrate can be bonded to the top of the first substrate. In some embodiments, a second continuous circuit trace can be printed on a second side of the first substrate comprising at least a second circulator.

The various aspects of the present invention may be more clearly understood and appreciated from a review of the following detailed description of the disclosed embodiments and by reference to the appended drawings and claims.

DETAILED DESCRIPTION OF THE INVENTION

Figure 1A:
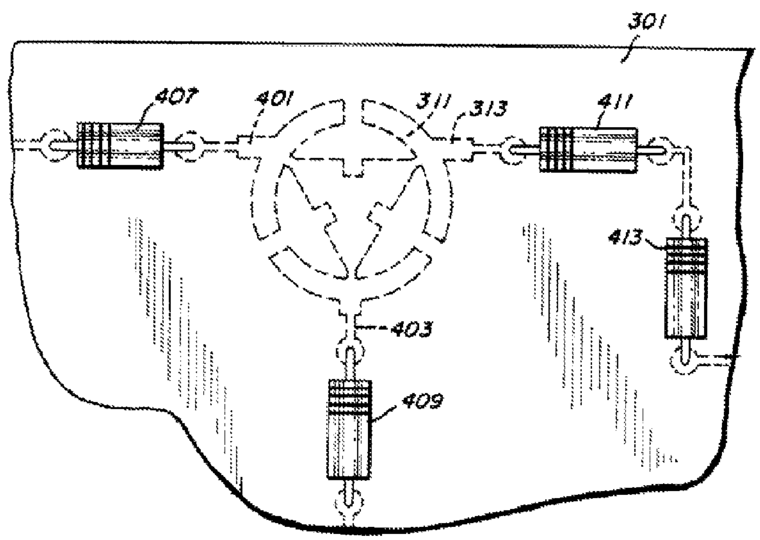
FIG. 1A is an illustration of a printed circulator on a printed circuit board ("PCB") with conventional through-hole mounted resistors.

To facilitate an understanding of the principles and features of the various embodiments of the invention, various illustrative embodiments are explained below. Although preferred embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an" and "the" include plural references unless the context clearly dictates otherwise. For example, reference to a component is intended also to include composition of a plurality of components. References to a system containing "a" component is intended to include other components in addition to the one named.

Also, in describing the preferred embodiments, terminology will be resorted to for the sake of clarity. It is intended that each term contemplates its broadest meaning as understood by those skilled in the art and includes all technical equivalents, which operate in a similar manner to accomplish a similar purpose.

Ranges may be expressed herein as from "about" or "approximately" one particular value and/or to "about" or "approximately" another particular value. When such a range is expressed, other exemplary embodiments include from the one particular value and/or to the other particular value.

The words "comprising," "containing," or "including" conveys that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

Figure 1B:
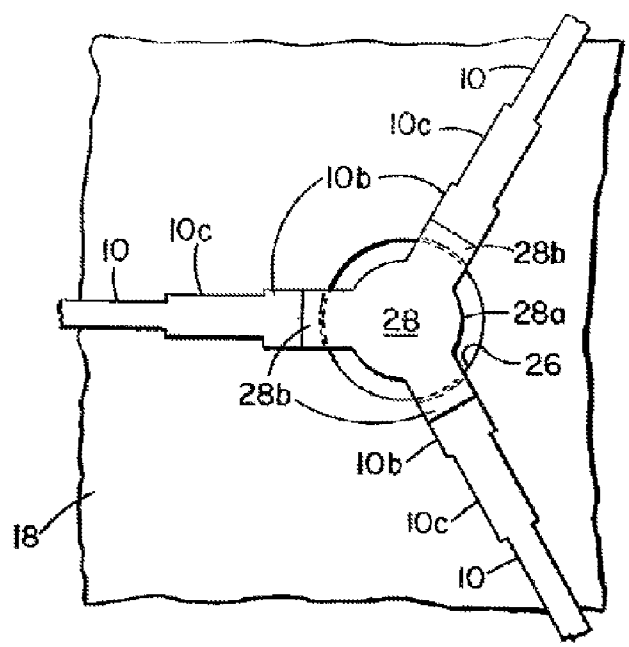
FIG. 1B is an illustration of a conventional circulator comprising impedance matching elements.
Figure 1C:
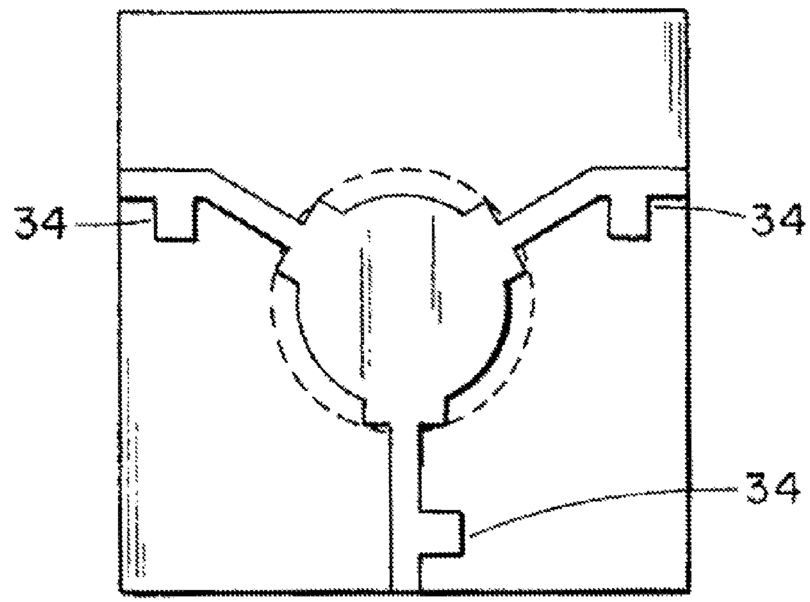
FIG. 1C is an illustration of a conventional circulator, which includes tuning tabs.
Figure 1D:
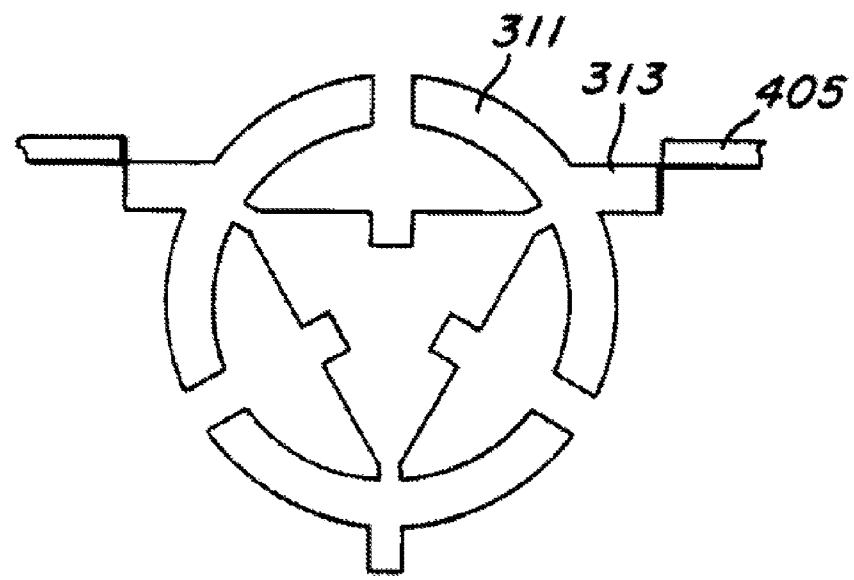
FIG. 1D is an illustration of a conventional circulator with mismatched port connections due to a discontinuous circuit trace.

Various tabs, slots, and other features can be used to change, for example and not limitation, the frequency response, the bandwidth, or the loading characteristics of a resonator. As shown in FIGS. 1A and 1D from Kane, for example, a circulator can comprise a central triangular conducting portion surrounded by a discontinuous ring. The slots in the ring act as a loading mechanism and enable the overall size of the resonator to be reduced. As mentioned above, FIG. 1B from Andre depicts a circulator comprising a central circular conducting portion 28 with ports 10 comprising impedance matching sections 10*b*, 10*c*. FIG. 1*c*, from U.S. Pat. No. 3,854,106 to Tresselt ("Tresselt) depicts a central circular conducting portion with tabs 34 mounted on the ports. These tabs enable the bandwidth of the circulator to be broadened or narrowed, as applicable.

For the sake of clarity, the term "circulator" as used herein refers to circulators in general, including various designs and including components (e.g., tabs, slots, and impedance matching sections) used to "tune" circulators. Components that affect the operation of the circulator itself, as opposed to the overall circuit, are considered part of the circulator as opposed to "external" components. In other words, as used herein, FIGS. 1B-1D depict only circulators without any external components. In addition, the actual design of the circulator is immaterial to embodiments of the present invention.

External components or external electronic components, as used herein, can include, for example and not limitation, additional circulators, a filter, an antenna, a power divider, or a power combiner. These components are located in the same circuit with, but outside, the circulator and are used primarily to modify the signal going through the circuit (as opposed to tuning the circulator itself). FIG. 2C, for example, depicts a circulator 110 in a continuous circuit trace with a filter 210. In this configuration, the filter 210 would be considered the "external" electronic component.

The term "continuous circuit trace," as used herein, can include circuits that are printed, vapor deposited ("sputtered"), laminated, etched, or otherwise deposited or manufactured on a printed circuit board ("PCB"). These circuits are made by printing the various components on the PCB and the components and are connected using printed conductors, or traces, as opposed to manual interconnects, soldering, or other mechanical connection means. PCB manufacturing reduces costs and reduces or eliminates impedance mismatches in connections. As a result, impedance matching measures, such as those described above, are unnecessary.

Embodiments of the present invention, therefore, relate to an apparatus, system, and method for providing a continuous circuit trace comprising one or more circulators and one or more external electronic components (e.g., a circulator, a resistor, or a filter). The one or more circulators and the one or more external components can be manufactured in a continuous circuit trace such that no manual interconnects are necessary. This, among other things, decreases manufacturing costs, increases reliability and performance, and reduces product size.

Figure 2A:
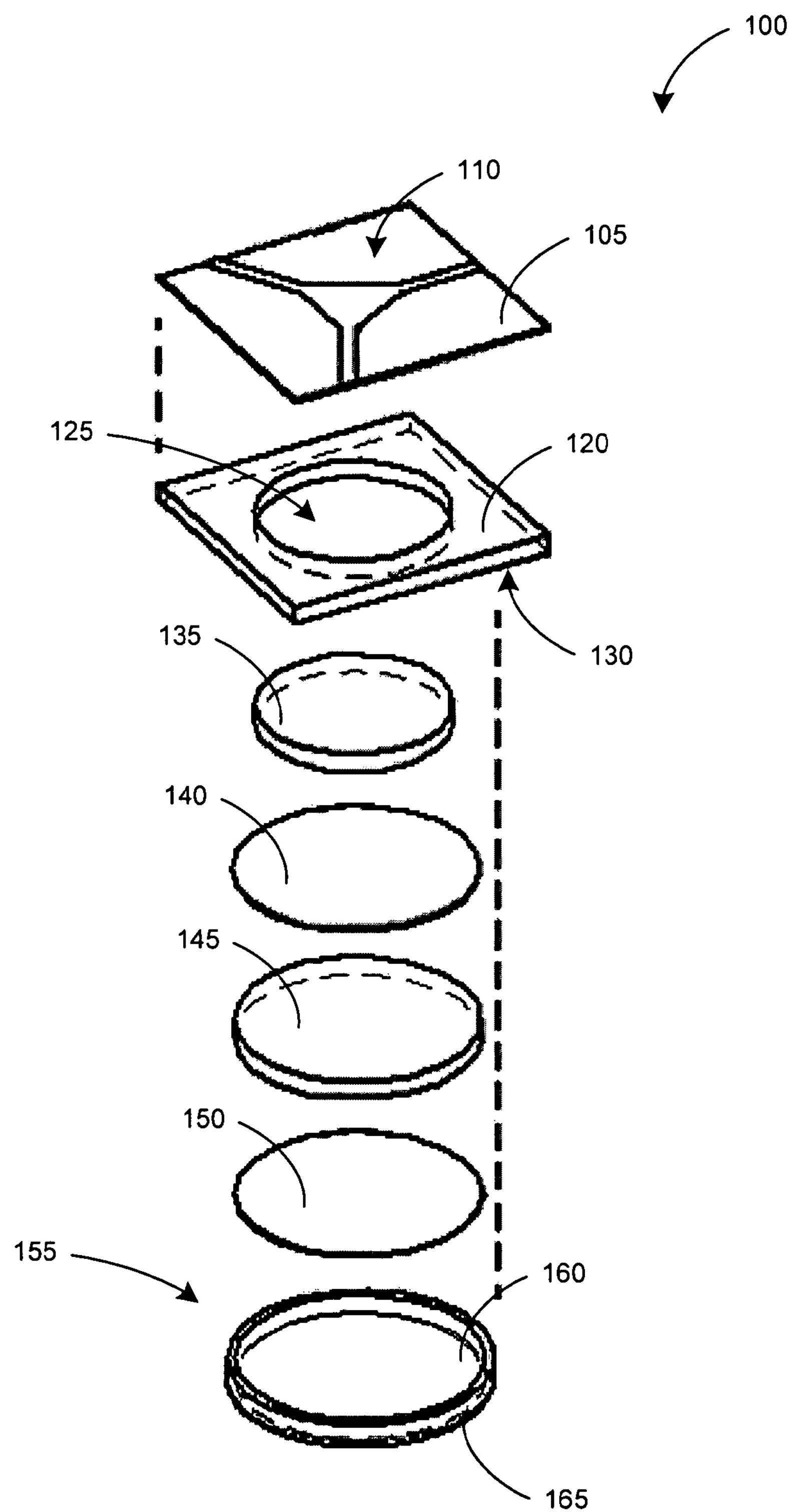
FIG. 2A is an illustration of an exploded view of a circulator assembly for use with a microstrip circuit in accordance with some embodiments of the present invention.

FIG. 2A is an exploded view of a circulator assembly 100 in accordance with some embodiments of the present invention. The circulator assembly 100 contains a single ground plane in what is commonly known as a "microstrip" configuration. The circulator assembly 100 includes a first substrate 105 that is made from a non-ferrous dielectric material and is used to support a circuit trace 110. Typically, the first substrate 105 is made from dielectric materials that are used in constructing conventional PCBs. For example, the first substrate 105 may be made from polymers, such as but not limited to polytetrafluoroethylene (PTFE), combinations of PTFE and woven glass fibers, PTFE and random micro fiber glass, PTFE and ceramic, polyamides and polyamide compositions including polyamide and glass, polyamide film, epoxy resins, such as cyanate ester, bisamalemide tiazine, and the like. However, the first substrate 105 may also be made from semiconductor material such as but not limited to silicon (Si), gallium arsenide (GaAs), indium antimonide (InSb), cadmium sulfide (CdS), and cadmium selenide (CdSe) for specialized applications.

The circuit trace 110 is applied to one side of the substrate 105 using standard PCB manufacturing techniques, such as physical vapor deposition (PVD), also known as "sputtering," chemical vapor deposition (CVD), and the like. The circuit trace 110 is a conductive material, such as gold (Au), silver (Ag), copper (Cu), aluminum (Al), titanium (Ti) and the like is first applied to the substrate 105. A mask that contains the pattern of the circuit element, in this case the pattern forms a circulator pattern 115, or circulator component 115 on the conductive material. The circulator pattern 115 can comprise a central conductor portion 115A and three or more connection ports 115B. In some embodiments, as shown, the circulator pattern 115 can comprise one or more notches, a discontinuous outer ring, or other components to alter or tune the behavior of the circulator 115.

Figure 2B:
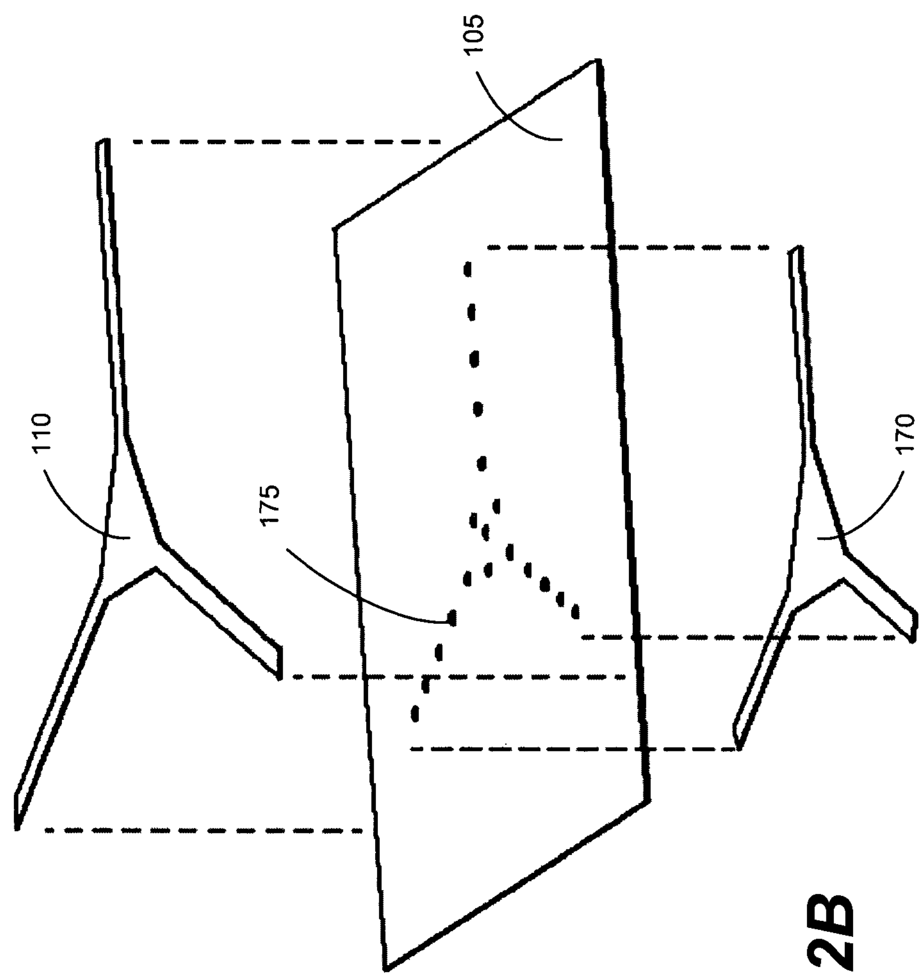
FIG. 2B is an illustration of an exploded view of a circuit trace for a circulator assembly in accordance with some embodiments of the present invention.
Figure 2C:
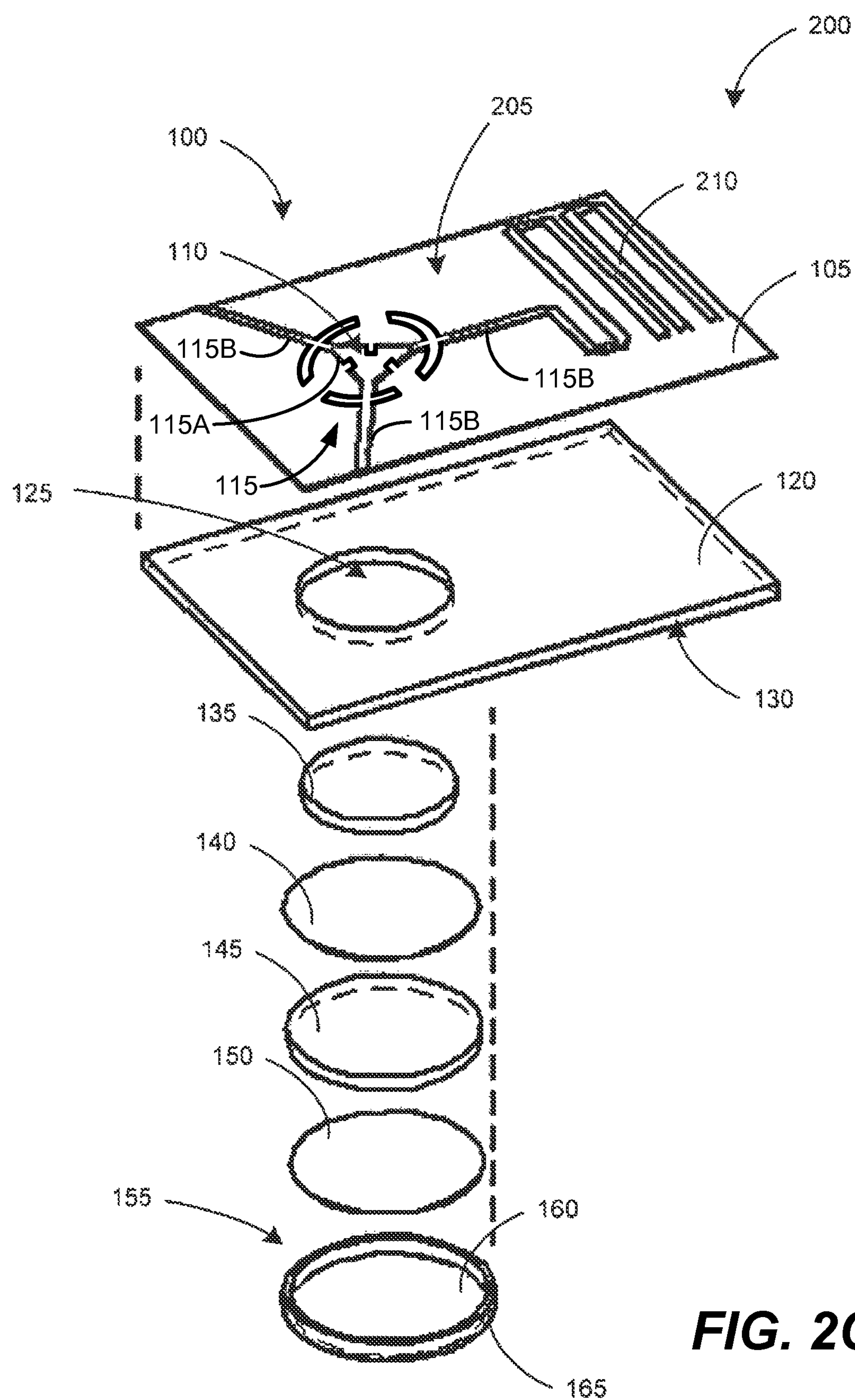
FIG. 2C is an illustration of an exploded view of a circulator assembly integrated with a microstrip circuit assembly in accordance with some embodiments the present invention.

The exposed conductive material is removed from the substrate. The mask is then removed leaving desired circuit trace 110. The circuit trace 110 of the circulator 100 created in this manner, forms a continuous trace with no discontinuities or irregularities. Alternatively, the circulator circuit trace 110 may be located on one side of the substrate 105 and connected through conductive vias 175 passing through the substrate 105 to a second circulator circuit trace 170 as shown in FIG. 2B. The use of the second circulator circuit trace 170 can increase performance by increasing bandwidth, lowering insertion loss, and improving isolation.

The circulator circuit trace 110 may have the form of any conventional circulator. In FIG. 2A, the circulator circuit trace 110 contains a RF resonator and three conductive transfer strips that extend from the points of the triangular resonator and terminate at electrodes or contact pads (not shown) for connecting to an external circuit. Although the circuit trace 110 is depicted as having a triangular-shaped RF resonator, those skilled in the art will appreciate that the circuit trace 110 may take on any shape that contains a central resonator and three equally spaced conductive transfer strips extending from the central RF resonator without departing from the scope of the invention. As mentioned above, the circulator 110 can also comprise various tuning elements to modify the behavior of the circulator 110.

The circulator assembly 100 also has a second substrate 120 disposed below the first substrate 105. The second substrate 120 is also made from a dielectric material and is preferably made from a dielectric material used for constructing PCBs, as described above. The second substrate 120 may be made from the same dielectric material as the first substrate 105 or may be made from a different dielectric material based on the design criteria. The second substrate 120 includes an aperture 125 that is proximately aligned with the circulator circuit trace 110. The aperture 125 is typically circular in shape; however, the aperture can also be any polygonal shape, such as a square, a triangle, a pentagon, a hexagon, and so forth. The bottom side of the second substrate 120 includes a cladding 130 that forms a continuous ground plane. The cladding 130 is a thin layer of a conductive material such as copper, gold, silver, aluminum, titanium, and the like.

The circulator assembly 100 also contains a ferrite element 135 disposed within the aperture 125 of the second substrate 120. The ferrite element 135 is circular in shape and has diameter that matches the diameter of the aperture 125 so that it may rigidly affixed into the aperture 125. Although the ferrite element 135 is typically described as being circular, the ferrite element 135 will have the same shape as the aperture 125 to insure that the ferrite element 135 self aligns itself with the circulator circuit trace 110 and minimize any discontinuities between the second substrate 120 and the ferrite element 135.

Disposed beneath the ferrite element 135 is a conductive material 140. The conductive material 140 is slightly larger than the aperture 125 to ensure that it makes electrical contact with the cladding 130, thereby providing a continuous ground plane across the circulator circuit trace 110. The conductive material 140 is typically very thin, approximately in the range from 0.001 inches to 0.003 inches. As a result, the conductive material 140 approximately coplanar with the cladding 130, which provide improved shielding and improved electrical performance over conventional circulators. In one exemplary embodiment, the conductive material 140 is a conductive thin film adhesive that can be cut into any desired shape. The conductive thin film adhesive 140 is simply adhered to the cladding 130 of the second substrate 120 making sure that it fully covers the aperture 125, thereby ensuring a continuous ground plane. In addition to completing the ground plane, the conductive tape also provides additional support to the ferrite element 135, thereby further securing it within the aperture 125 and eliminating the outer support casing required for conventional circulators. In another exemplary embodiment, the conductive material 140 may be a conductive adhesive, such as conductive two-part epoxy. The conductive two-part epoxy is applied across the aperture in a thin layer while in the molten state, typically having a thickness approximately between 0.001 inches and 0.003 inches and allowed to cure. In yet another exemplary embodiment, the conductive material 140 may simply be a thin metal film. The metal film can be secured to the cladding using a thin bead of adhesive.

The circulator assembly 100 also contains a magnet 145 located below the conductive material 140 and proximately aligned with both the ferrite material 135 and the circulator circuit trace 110. In an exemplary embodiment, the magnet 145 is a permanent magnet and is polarized to produce a direct current (DC) biased magnetic field that passes through the ferrite material 135 and the circulator circuit trace 110. The magnet 145 is held in place by the conductive material 140.

The circulator assembly 100 may also contain a yoke 155 that is disposed beneath the magnet 145. The yoke 155 is typically slightly larger than the magnet 145 and has a plate 160 and a tang 165 that extends around the periphery of the plate 160. The tang 165 has a height sufficient to cover the magnet 145 to provide both a DC magnetic field return path and adequate shielding from external magnetic fields.

The circulator assembly 100 also contains three connection pads (not shown) at the ends of each of the three conductive strips of the circulator circuit trace 110 that electrically connect the circuit assembly 100 to an external circuit. The connection pads may be mouse holes, which are known in the art. Alternatively, the connection pads may be formed on the underside of the second substrate 120 for use as a surface mounted component.

FIG. 2C is an illustration of an exploded view of a microstrip circuit 200 containing the circulator assembly 100. As shown by the figure, the circulator assembly 100 comprises circular loading mechanisms and is fully integrated into the microstrip circuit 200 as opposed to being connected through manual interconnections as required by conventional circulators. The microstrip circuit 200 contains a continuous circuit trace 205 deposited or etched on a first substrate 105. The continuous circuit trace 205 contains at least one circulator circuit trace 110 electrically connected to at least one other external RF component 210 (as opposed to components associated with the circulator, as mentioned above). The RF component 210 may be a filter component, a coupler component, or any other type of RF component. The RF component 210 may even be another circulator. Because the circulator circuit trace 110 is integrated within the continuous circuit trace 205 that contains the RF component 210, there are no discontinuities or manual interconnects between the circulator circuit trace 110 and the RF component 210. Integration of the circulator assembly 100 provides several advantages over conventional circulator designs. First, because conventional circulator designs require interconnects between the circulator and an external circuit element, there will always be an impedance mismatch at the interconnect, which results in unwanted signal degradation through the system. However, since the circulator circuit trace 110 is integrated within the circuit trace 205, there is no impedance mismatch between the circulator circuit trace 110 and the electronic component 210. Therefore, there is little to no signal degradation at the interfaces between the circulator assembly 100 and other connecting RF components 210. Second, because interconnects bridge a discontinuity in a circuit trace, conventional circulators tend to have high insertion losses at the interconnects. Since the present invention eliminates any interconnects, insertion losses associated with those interconnects are eliminated. Additionally, by eliminating the interconnects, there are no discontinuities when connecting the circulator assembly 100 into the microstrip circuit 200 to allow RF interference to enter the microstrip circuit 200. As a result, interference due to unwanted RF signals in the circulator assembly 100 is greatly reduced.

A second substrate 120, which contains a cladding 130 on the outside surface, is disposed below the first substrate 105. The second substrate 120 contains an aperture 125 that is aligned with the circulator circuit trace 110 of the continuous circuit trace 205. Typically, the first substrate 105 is much thinner than the second substrate. The first substrate 105 has a thickness in the range of approximately 0.001 inches to 0.010 inches, while the second substrate 120 has a thickness in the range of approximately 0.010 inches to 0.070 inches. In one exemplary embodiment the first substrate 105 has a thickness in the range of approximately 0.003 inches to 0.007 inches, and more preferably 0.005 inches, while the second substrate 120 has a thickness in the range of approximately 0.01 inches to 0.07 inches, and more preferably 0.03 inches. Those skilled in the art will appreciate that the thicknesses of the first substrate 105 and the second substrate 120 are necessarily not limited to the values herein provided and may be adjusted to any thickness as required by a particular design.

A ferrite element 135 is located within the aperture 125. Beneath the ferrite element 135 is a conductive material 140. In an exemplary embodiment, the conductive material 140 is made from a conductive thin film adhesive, which is laid across the ferrite element 135. The conductive material 140 is slightly larger than the aperture 125. This allows the conductive material 140 to make electrical contact with the cladding 130 and form a continuous ground plane over the entire continuous circuit trace 205. Maintaining the ground plane that is continuous over the entire continuous circuit trace 205 provides improved shielding of the microstrip circuit 200 from unwanted external RF signals. Furthermore, since the conductive material 140 is made from a thin film, typically on the order of approximately 0.001 inches, the conductive material 140 is substantially planar with the cladding 130, which improves electrical performance of the microstrip circuit 200, since path length along the ground plane is substantially the same as the path length along the continuous circuit trace 205.

A magnet 145 is disposed below the conductive material 140 and is proximally aligned with the ferrite element 135.

The magnet 145 is used to induce a biased magnetic field through the ferrite element 135. A yoke 155 may then be bonded to the magnet 145 using an adhesive material 150 to provide a return path for the biased magnetic field and also shield the circulator assembly 100 from unwanted external magnetic fields.

Figure 3:
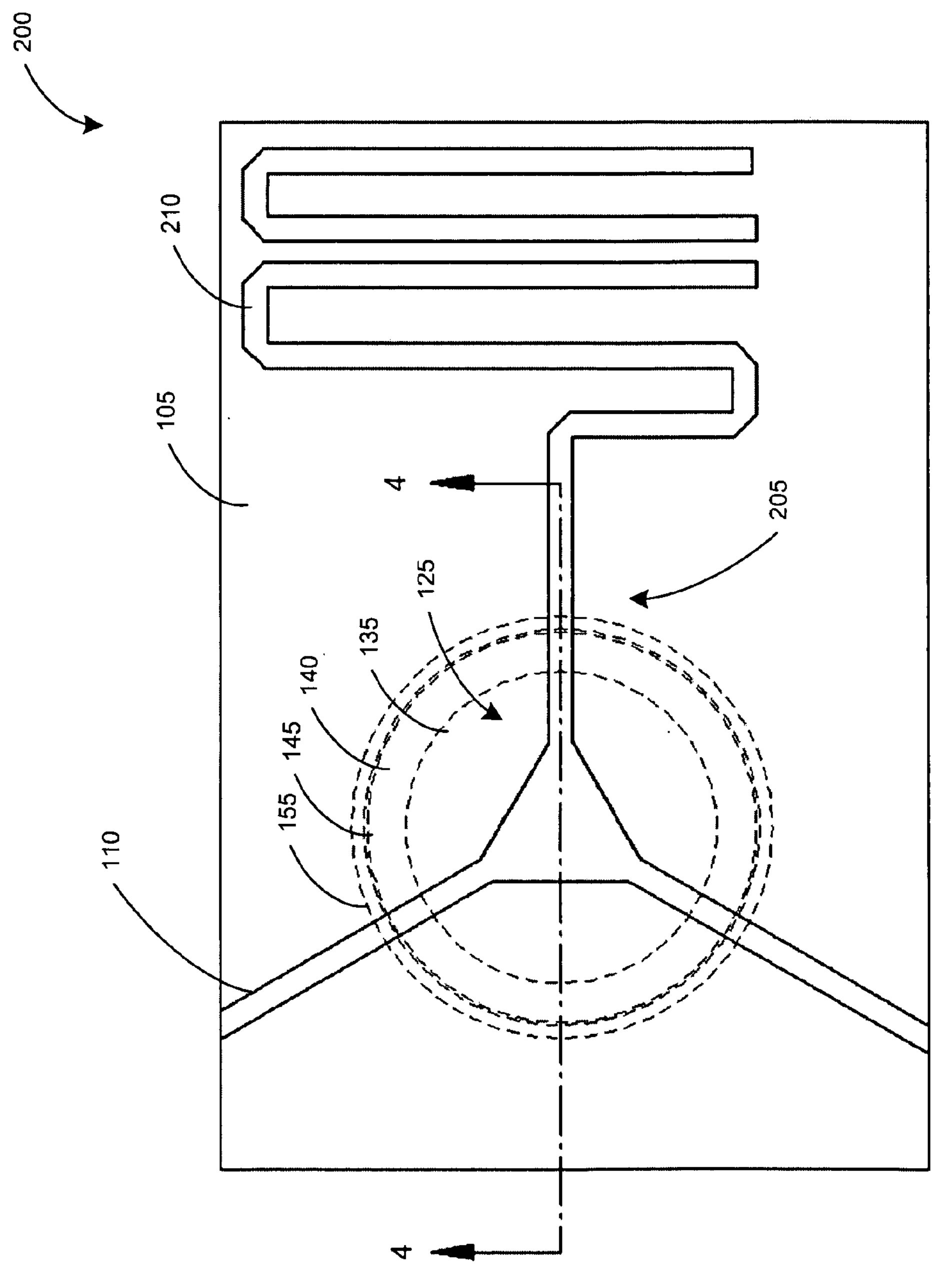
FIG. 3 is an illustration of an overhead view of a circulator assembly integrated with the microstrip circuit assembly in FIG. 2A in accordance with some embodiments of the present invention.

FIG. 3 is a top-down view of the microstrip circuit 200 containing the integrated circulator assembly 100 of FIG. 2, in accordance with some embodiments of the present invention. The continuous circuit trace 205 containing the circulator circuit trace 110 and another RF component 210 is shown by the figure. Disposed beneath the first substrate 105 is the second substrate 120 (not shown), which contains the ferrite material 135 located within the aperture 125. As seen from the figure, the ferrite material 135 is proximately aligned with the central RF resonator of the circulator circuit trace 110. The conductive material 140 extends beyond the aperture 125 to provide an electrical contact with the cladding 130 (not shown) on the backside of the second substrate 120 (not shown). The conductive material 140 is also proximately aligned with the aperture 125.

Figure 4:
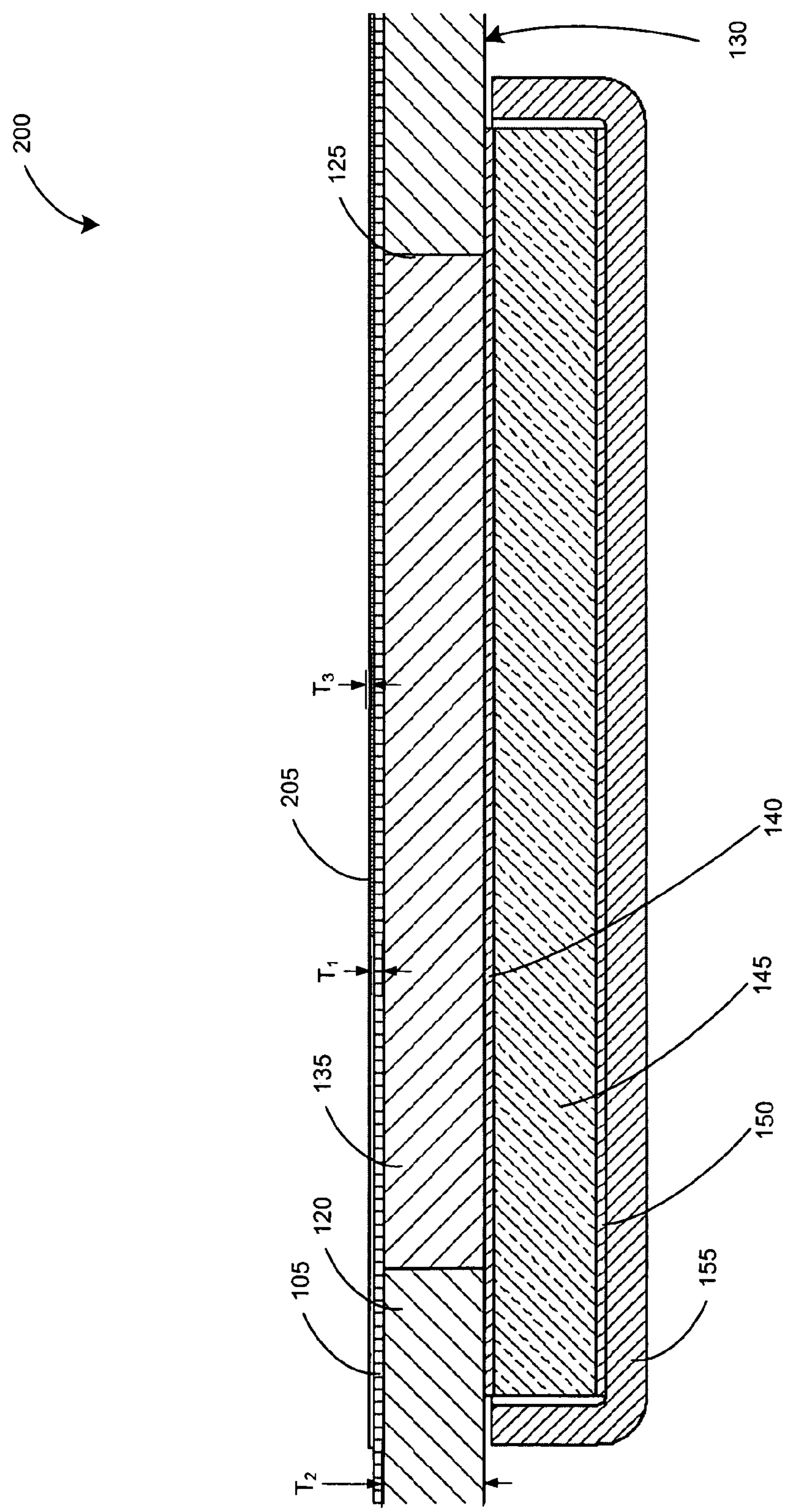
FIG. 4 is an illustration of a cross-sectional view of the circulator assembly taken along the 4-4 line of FIG. 3 in accordance with some embodiments of the present invention.

FIG. 4 is a cross-sectional view of a portion of the microstrip circuit 200 taken along the 4-4 line of FIG. 3. The continuous circuit trace 205, which contains the circulator circuit trace 110, is located on the top surface of the first substrate 105. The first substrate 105 is composed of a thin layer of a nonferrous dielectric material, such as PTFE, or other materials used for the manufacture of PCBs. The first substrate 105 is relative thin and has a thickness, $T_1$ that in the range of approximately 0.001 inches to 0.010 inches, while the second substrate 120 has a thickness $T_2$, in the range of approximately 0.010 inches to 0.070 inches. In one exemplary embodiment the first substrate 105 has a thickness $T_1$, in the range of approximately 0.003 inches to 0.007 inches, and more preferably 0.005 inches, while the second substrate 120 has a thickness $T_2$, in the range of approximately 0.01 inches to 0.07 inches, and more preferably 0.03 inches. Those skilled in the art will appreciate that the thicknesses $T_1$ and $T_2$ of the first substrate 105 and the second substrate 120 respectively, are necessarily not limited to the values herein provided and may be adjusted to any thickness as required by a particular design. The continuous circuit trace 205 is typically deposited on top of the first substrate 105 in a very thin layer, having a thickness, $T_3$, in the range of approximately 0.0008 inches to 0.0015 inches.

The second substrate 120 is bonded to the bottom of the first substrate 105 using standard circuit board adhesives known in the art. The second substrate 120 is also made from non-ferrous dielectric materials, which are used for the construction of PCBs, such as PTFE and the like. In one exemplary embodiment, the second substrate 120 and the first substrate 105 are made from the same dielectric material. However, those skilled in the art will appreciate that the first substrate 105 and the second substrate 120 may be made from different non-ferrous dielectric materials with different dielectric constants, as required by a particular application. The bottom of the second substrate 120 also contains a thin cladding 130 that provides the ground plane for the microstrip circuit 200.

Integrated within the second substrate 120 is the ferrite material 135. The ferrite material 135 is disposed in the aperture 125, which has been milled into the second substrate 120. Alternatively, the ferrite material 135 may be affixed in the aperture 125 using a conventional heat resistant, non-conductive adhesive material, such as a two-part epoxy, which is known in the art. The ferrite material 135 has substantially the same thickness, $T_2$, as the second substrate 120 so the top of the ferrite material 135 and the top of the second substrate 120, and the bottom of the ferrite material 135 and the bottom of the second substrate 120, form substantially coplanar surfaces. This allows the first substrate 105 to lay flat upon the second substrate 120 without any significant variation in height at the interface between the second substrate 120 and the ferrite material 135, as any variation may stress the first substrate 105. Stresses in the first substrate 105 may lead to cracking or even rupture of the first substrate 105 above the interface between the second substrate 120 and the ferrite material 135, which can lead to degradation in the performance or even complete failure of the stripline circuit 200. The desirability to have the bottom of the ferrite material 135 and the bottom of the second substrate 120 being substantially coplanar is to provide planar ground plane, which has previously been discusses.

The conductive material 140 is disposed on the underside of the second substrate 120. The conductive material 140 extends beyond the boundary of the aperture 125 so that it provides sufficient electrical contact with the cladding 130 on the underside of the second substrate 120, thereby providing a continuous ground plane for the microstrip circuit 200. In addition to providing a continuous ground plane across the ferrite element 135, the conductive material 140 also bonds the ferrite element 135 in the aperture 125 of the second substrate 120. In addition, the conductive material 140 has sufficient flexibility to accommodate small variances in the thickness between the second substrate 120 and the ferrite element 135 due manufacturing tolerances. The magnet 145 is larger than the aperture 125 and is also aligned with the ferrite element 135 to ensure that the ferrite element 135 is completely covered. Finally, the yoke 155 is bonded to the magnet 145 using an adhesive material 150. The tang 165 (FIG. 2) of the yoke 155 extends in an upward direction from the plate 160 (FIG. 2) and fully surrounds the magnet 145 thereby shielding the magnet 145 from external magnetic fields that may interfere with the operation of the circulator assembly 100.

Figure 5:
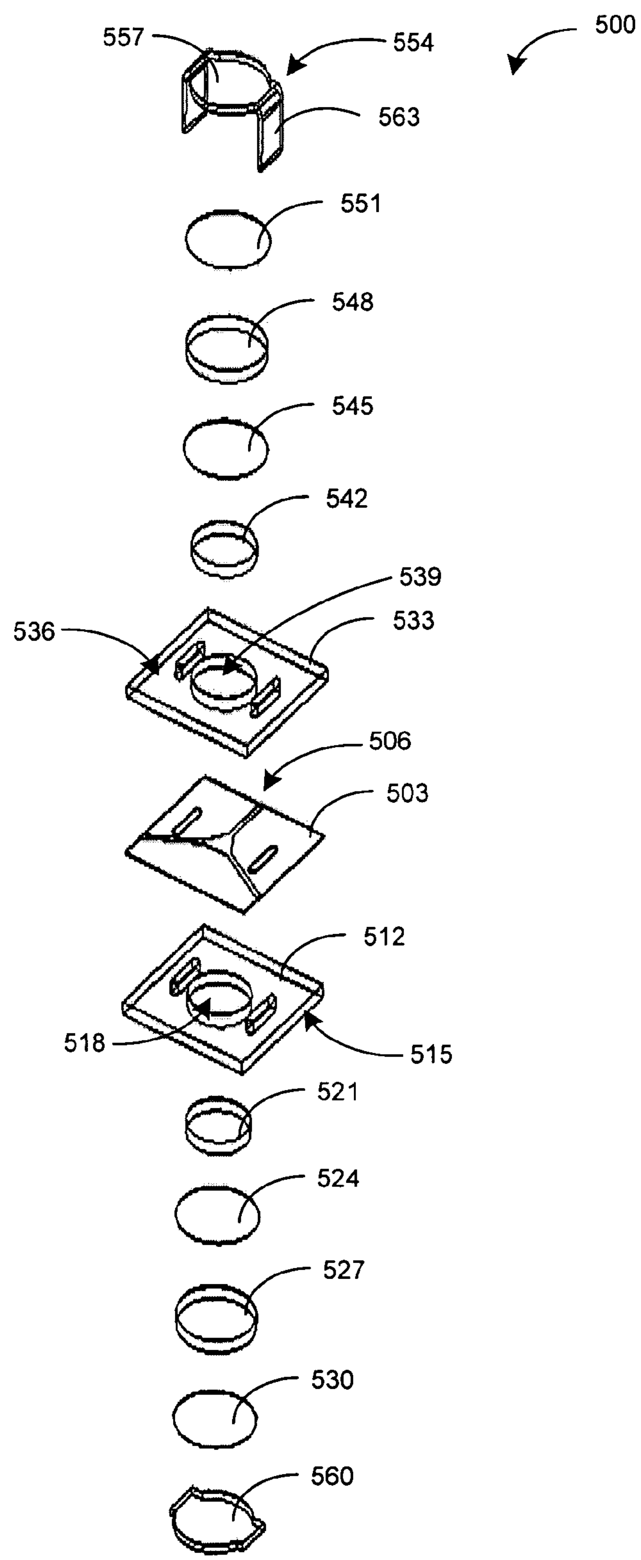
FIG. 5 is an illustration of an exploded view of an exemplary embodiment of a circulator assembly for use with a stripline circuit in accordance with some embodiments of the present invention.
Figure 6:
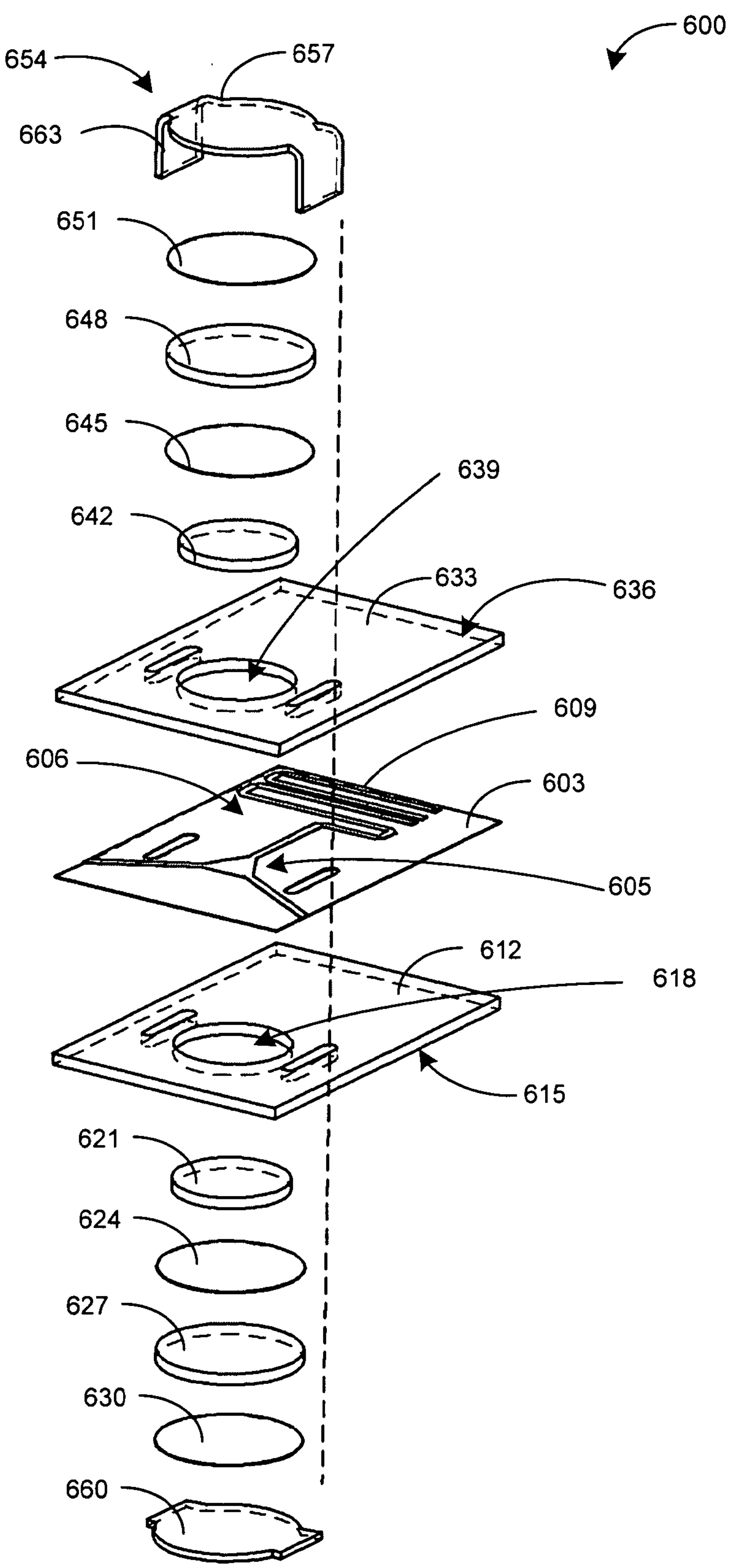
FIG. 6 is an illustration of an exploded view of a circulator assembly integrated within a stripline circuit assembly in accordance with some embodiments of the present invention.

FIG. 5 is an exploded view of an exemplary embodiment of a circulator assembly 500 arranged in a stripline configuration in accordance with some embodiments of the present invention. The circulator assembly 500 includes a first substrate 503 that supports a circulator circuit trace 506. The first substrate 503 is composed of a thin layer of nonferrous dielectric material, such as PTFE, and other materials used for the manufacture of PCBs. The circulator circuit trace 506 contains a triangular-shaped central resonator and three conductive transfer strips spaced equally around the perimeter of the triangular-shaped central resonator. Those skilled in the art will appreciate that other shapes may be used for the central resonator, without departing from the scope of the invention.

The circulator assembly 500 also contains a second substrate 512 that is positioned below the first substrate 503 and a third substrate 533 that is positioned above the first substrate 503, thereby forming a laminar structure. The second substrate 512 and the third substrate 533 are also made from a non-ferrous dielectric material. In an exemplary embodiment, the second substrate 512 and the third substrate 533 are made from the same dielectric material used for the first substrate 503. In another exemplary embodiment, the second substrate 512 and the third substrate 533 are made from a dielectric material that is different from the dielectric material used for the first substrate 503.

The second substrate 512 contains a first cladding 515 disposed on the bottom exterior surface (not shown). Similarly, the third substrate 533 contains a second cladding 536 deposited on the top exterior surface. The first and second claddings 515 and 536 are formed by depositing a thin layer of metal using standard deposition techniques, such as PVD, CVD, and the like. The second substrate 512 and the third substrate 533 each contain an aperture 518 and 539, respectively. The apertures 518 and 539 are aligned with the circulator circuit trace 506 on the first substrate 503. A first ferrite element 521 is inserted into the first aperture 518 and a second ferrite element 542 is inserted into the second aperture 539. The ferrite elements 521 and 542 are typically placed into the apertures 518 and 539, respectively. However, the ferrite elements 521 and 542 may be affixed in the apertures 518 and 539 using an adhesive, such as a two-part epoxy and the like.

A first conductive material 524 is disposed across the underside of the first ferrite element 521. Similarly, a second conductive material 545 is placed across the top of the second ferrite element 542. In an exemplary embodiment, the conductive materials 524 and 545 are formed from conductive thin film adhesive, which are slightly larger than the apertures 518 and 539. The conductive thin film adhesives make electrical contact with the claddings 515 and 536 to provide two continuous ground planes, which shield the circulator circuit trace 506 from unwanted RF radiation. Alternatively, rather than using a conductive thin film adhesive, the conductive materials 524 and 545 may be made from a conductive adhesive, such as a conductive two-part epoxy. Typically, the conductive materials 524 and 545 are relatively thin. As a result, the conductive materials 524 and 545 are approximately coplanar with the claddings 515 and 536.

The circulator assembly 500 also contains a first magnet 527 disposed below the first ferrite element 521. Similarly, a second magnet 548 is located above the second ferrite element 542. Both the first magnet 527 and the second magnet 548 are proximately aligned with the circulator circuit trace 506 to produce a DC biased magnetic field that passes through the ferrite elements 521 and 542 and the circulator circuit trace 506.

The circulator assembly 500 may also have a yoke 554 that has a top plate 557 and a bottom plate 560. The top plate 557 of the yoke 554 is placed on top of the second magnet 548. A first adhesive material 551 may be inserted between the top plate 557 and the second magnet 548 to affix the top plate 557 to the second magnet 548. Similarly, the bottom plate 560 is disposed on the bottom of the first magnet 527 and may be bonded to the first magnet 527 by a second adhesive material 530. In an exemplary embodiment, the first adhesive material 551 and the second adhesive material 530 are made from the same conductive material that is used to complete the ground planes across the second substrate 509 and the third substrate 533.

The yoke 554 may also contain at least one tang 563 that extends between the top plate 557 and the bottom plate 560 and provides a return path for the magnetic field induced by the magnets 527 and 548. In an exemplary embodiment, the yoke 554 includes two tangs 563, which pass through a first pair of cutouts in the first substrate 503, a second pair of cutouts in the second substrate 512, and a third pair of cutouts in the third substrate 533 and connects to the bottom plate 560. The top plate 557 and the bottom plate 560 of the yoke 554 are approximately the same size or slightly larger than the magnets 527 and 548 to provide sufficient shielding to the circulator circuit trace 506. Although the yoke 554 has been described as having two tangs 563, those skilled in the art will appreciate that the yoke 554 may have either a single tang 563 or three tangs 563 located intermediate of the three conductive strips of the circulator circuit trace 506. Each of the first pair of cutout, the second pair of cutouts, and the third pair of cutout are edge plated to provide additional shielding and isolation for the circulator assembly 500.

The circulator assembly 500 also contains three connection pads (not shown) at the ends of each of the three conductive strips of the circulator circuit trace 506 that electrically connect the circulator assembly 500 to an external circuit. The connection pads may be mouse holes, which are known in the art. Alternatively, the connection pads may be formed on the underside of the second substrate 512 for use as a surface mounted device. The connection pads may be formed on the underside of the second substrate 512 by etching vias through the second substrate 512 up to each of the three conductive strips. The vias are then filled with a conductive material such as copper, gold, silver, aluminum, and the like.

A stripline circuit 600 in accordance with some embodiments of the present invention is shown in FIGS. 6-9. The stripline circuit 600 includes at least one circulator assembly 500 (FIG. 5) that is integrated into the stripline circuit 600. The circulator assembly 500 is integrated with at least one external RF component 609 in a continuous circuit trace 606 etched on a first substrate 603 in accordance with some embodiments of the present invention. The RF component 609 may be a filter component, a coupler component, or any other type of electronic component. Because the circulator circuit trace 605 is integrated with the continuous circuit trace 606, there are no discontinuities or interconnects between the circulator circuit trace 506 and the RF component 609. As with the microstrip circuit 200, this configuration provides several advantages over conventional circulator designs, including improved impedance matching between the circulator assembly 500 and the other electronic components 609, low insertion losses, improved shielding to unwanted RF signals, and greater reliability. Although the stripline circuit 600 is shown with a single circulator assembly 500 integrated with a single RF component 609, those skilled in the art will appreciate that the stripline circuit 600 may be expanded to include any number of circulator assemblies 500 integrated with any number of RF components 609 without departing from the scope of the invention.

A second substrate 612 and the third substrate 633 are disposed below and above the first substrate 603, respectively and have claddings 615 and 636 deposited on their respective outside surfaces. The second substrate 612 and third substrate 633 contain apertures 618 and 639, respectively, which are proximately aligned with the circulator circuit trace 605. Ferrite elements 621 and 642 are disposed within the apertures 618 and 639. Conductive material 624 and 645 overlap the apertures 618 and 639. In an exemplary embodiment, the conductive materials 624 and 645 are made from a conductive thin film adhesive, which is laid across the ferrite elements 621 and 642. Because the conductive thin film adhesive 624 and 645 are larger than the apertures 618 and 639, the thin film adhesive makes electrical contact with the claddings 615 and 636 and forms continuous ground planes over the entire continuous circuit trace 606. Maintaining ground planes that are continuous over the entire continuous circuit trace 606 provides improved shielding of the stripline circuit 600 from unwanted external RF signals. Furthermore, since the conductive materials 624 and 645 are made from a conductive thin film adhesive, which has a thickness typically on the order of approximately 0.001 inches, the conductive film is substantially planar with the claddings 615 and 636, which further improves the electrical capabilities since the path length along the ground planes are substantially the same length as the path length of the continuous circuit trace 606. Magnets 627 and 648 are disposed below and above the conductive material 624 and 645 and are proximally aligned with the ferrite elements 621 and 642. The yoke 654 may then be bonded to the magnets 627 and 648 using an adhesive material 630 and 651 to provide a return path for the DC biased magnetic field and also to provide shielding to the circulator assembly 500 (FIG. 5) from unwanted external magnetic fields.

Figure 7:
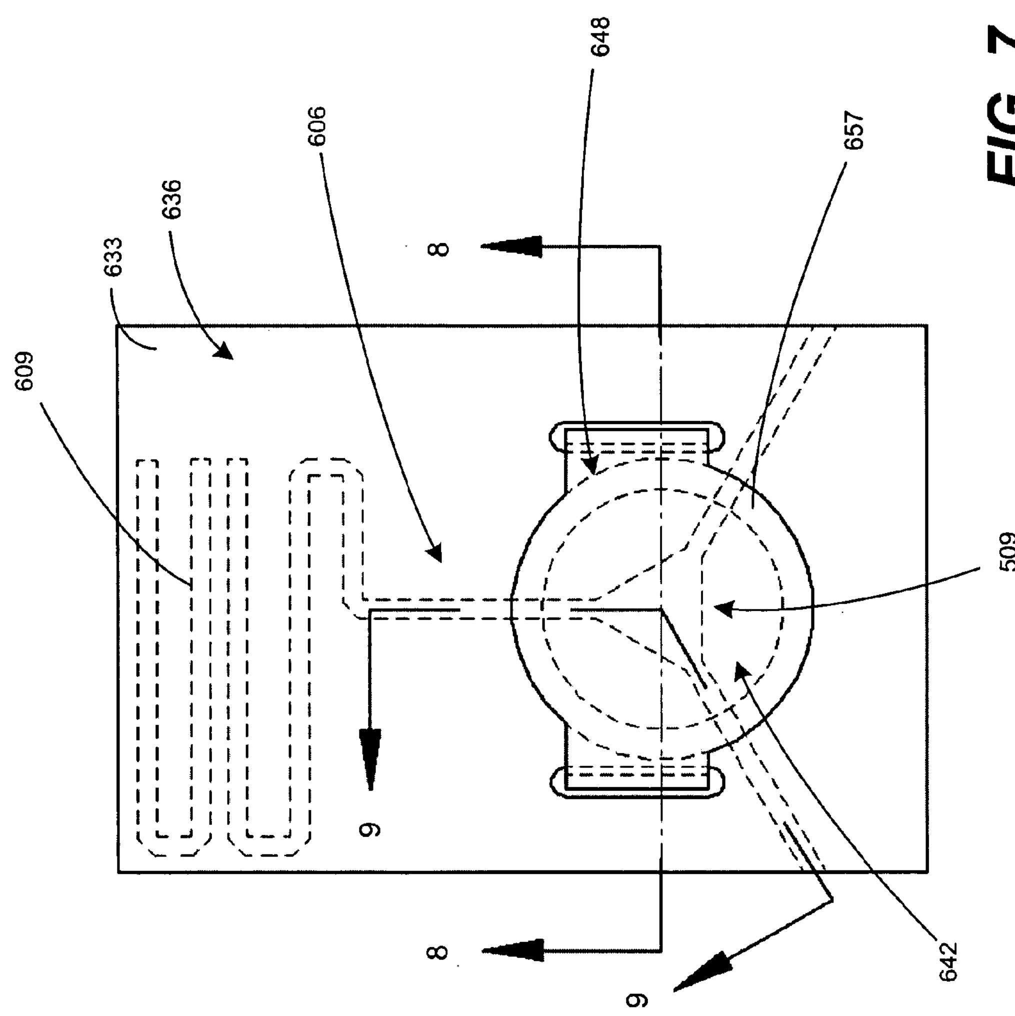
FIG. 7 is an illustration of an overhead view of a circulator assembly integrated within a stripline circuit assembly in accordance with some embodiments of the present invention FIG. 8A and FIG. 8B, collectively known as FIG. 8, are illustrations of a cross-sectional view of the circulator assembly taken along the 8-8 line of FIG. 7 in accordance with some embodiments of the present invention.

FIG. 7 is an overhead view of the stripline circuit 600 in accordance with some embodiments of the present invention. The first substrate 603 (not shown), which carries the continuous circuit trace 606 that shown in broken lines, is disposed between a second substrate 612 (not shown) and a third substrate 633. The continuous circuit trace 606 includes the circulator circuit trace 605 electrically connected to the RF component 609. Since the circulator circuit trace 605 and the RF component 609 are integrated into the same continuous circuit trace 606, there are no interconnects between the circulator circuit trace 605 and the RF component 609. This allows the stripline circuit 600 to have better electrical properties, such as improved impedance matching between the circuit components, improved signal transmission, and improved heat distribution through the continuous circuit trace 606.

In addition, the cladding 636 cover the entire exterior, or top surface, of the third substrate 633. The conductive material 645 extends beyond the aperture 639 to provide an electrical contact with the cladding 636 to form a continuous ground plane over the entire continuous circuit trace 606. This allows the circulator circuit trace 605 to share a common ground with the RF component 609. Having a common ground between the circulator circuit trace 605 and the RF component 609 provides several advantages over conventional circulators. The common ground plane provides increased shielding of the continuous circuit trace 606 from external RF radiation. The common ground plane also increases line isolation and reduces radiative emissions from the stripline circuit 600 to improve the electrical performance of the stripline circuit 600.

Figure 8A:
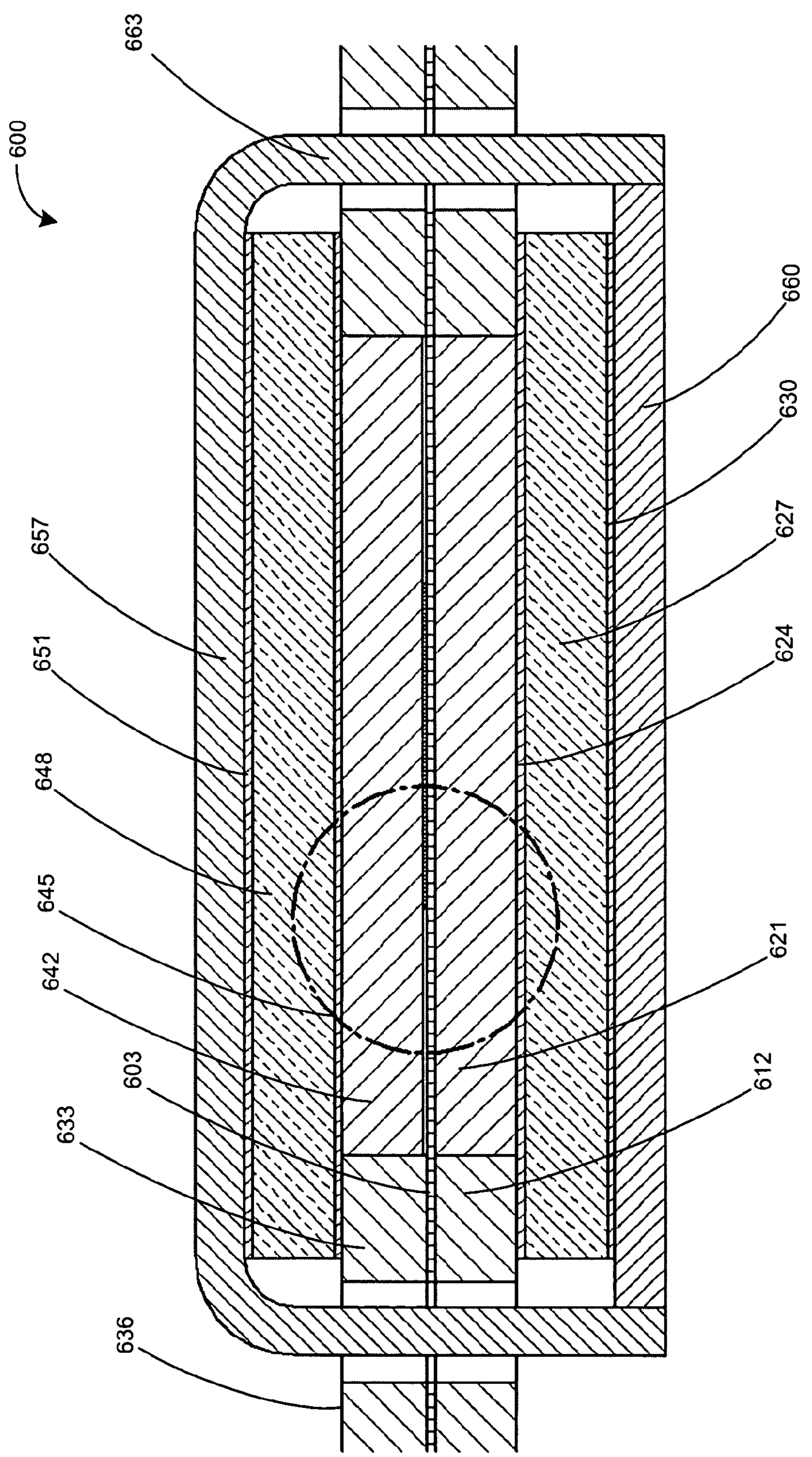
Figure 8B:
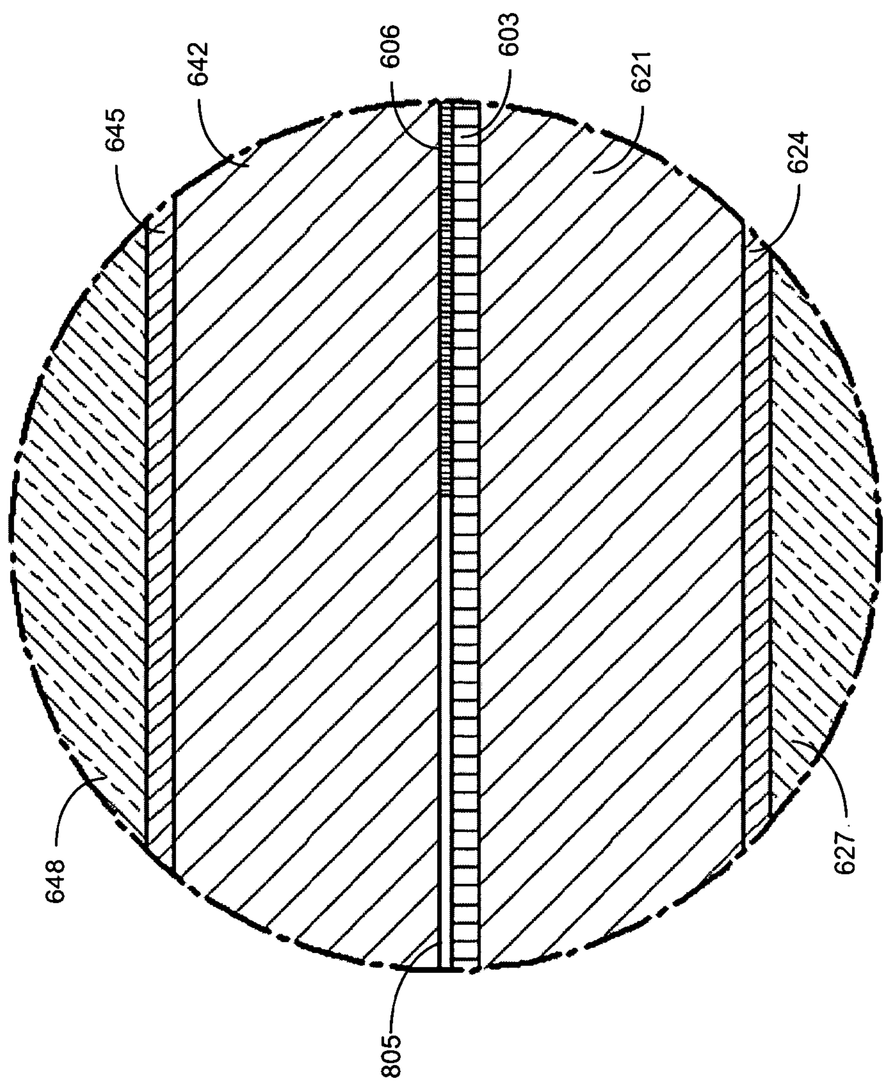
Figure 9:
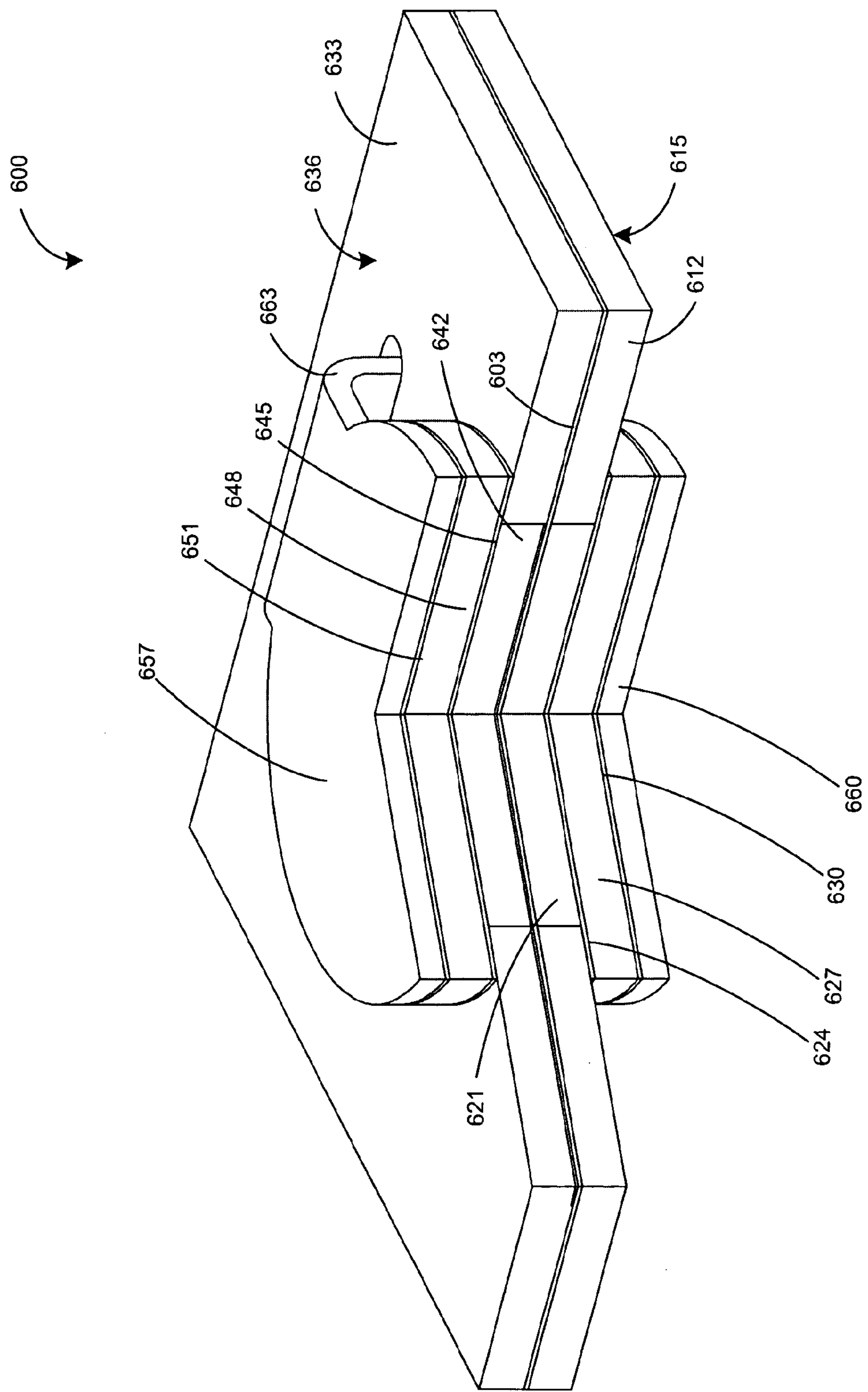
FIG. 9 is an illustration of an isometric view of the circulator assembly taken along the 9-9 line of FIG. 7 in accordance with some embodiments of the present invention.

Referring to FIGS. 8A, 8B and FIG. 9, a cross-sectional view of a portion the stripline circuit 600 is shown. In particular, FIG. 8A is an illustration of a cross-section of the circuit assembly 600 taken along the 8-8 line of FIG. 7, while FIG. 8B is a magnified view of the cross-section shown in FIG. 8A. FIG. 9 is an illustration of an isometric view of the stripline circuit 600 taken along the 9-9 line of FIG. 7. The cross sectional views illustrate the relative thickness of the first substrate 603 to the second and third substrates 612 and 633. The first substrate 603 has a thickness, $T_1$ that is in the range of approximately 0.001 inches to 0.010 inches. The second and third substrates 612 and 633 typically have the same thickness, $T_2$ that is greater than the thickness of the first substrate 603 and in the range of approximately 0.01 inches to 0.07 inches. In a preferred embodiment, the first substrate 603 has a thickness $T_1$, in the range of approximately 0.003 inches to 0.007 inches and more preferably about 0.005 inches, while the second substrate has a thickness $T_2$, in the range of approximately 0.01 inches to 0.07 inches, and more preferably about 0.03 inches. The detail of a portion of the continuous circuit trace 606 is shown in FIG. 8B to show its relative thickness. Typically, the continuous circuit trace 606 is very thin and has a thickness $T_3$, usually in the range of approximately 0.25 ounces/meter$^2$ (oz/m$^2$) to 1.0 (oz/m$^2$). Any gaps 805 (FIG. 8B) between the first substrate 603 and the third substrate 633 are filled with a standard thermally stable adhesive, which is well known in the manufacturing of PCBs. The continuous circuit trace 606 is substantially uniform along its entire path due to the elimination of interconnects between the circulator assembly 500 and the RF component 609. The uniformity of the circuit trace 606 leads to the improved heat distribution along the continuous circuit trace 606, which allows the stripline circuit 600 to handle higher power signals.

Figure 10:
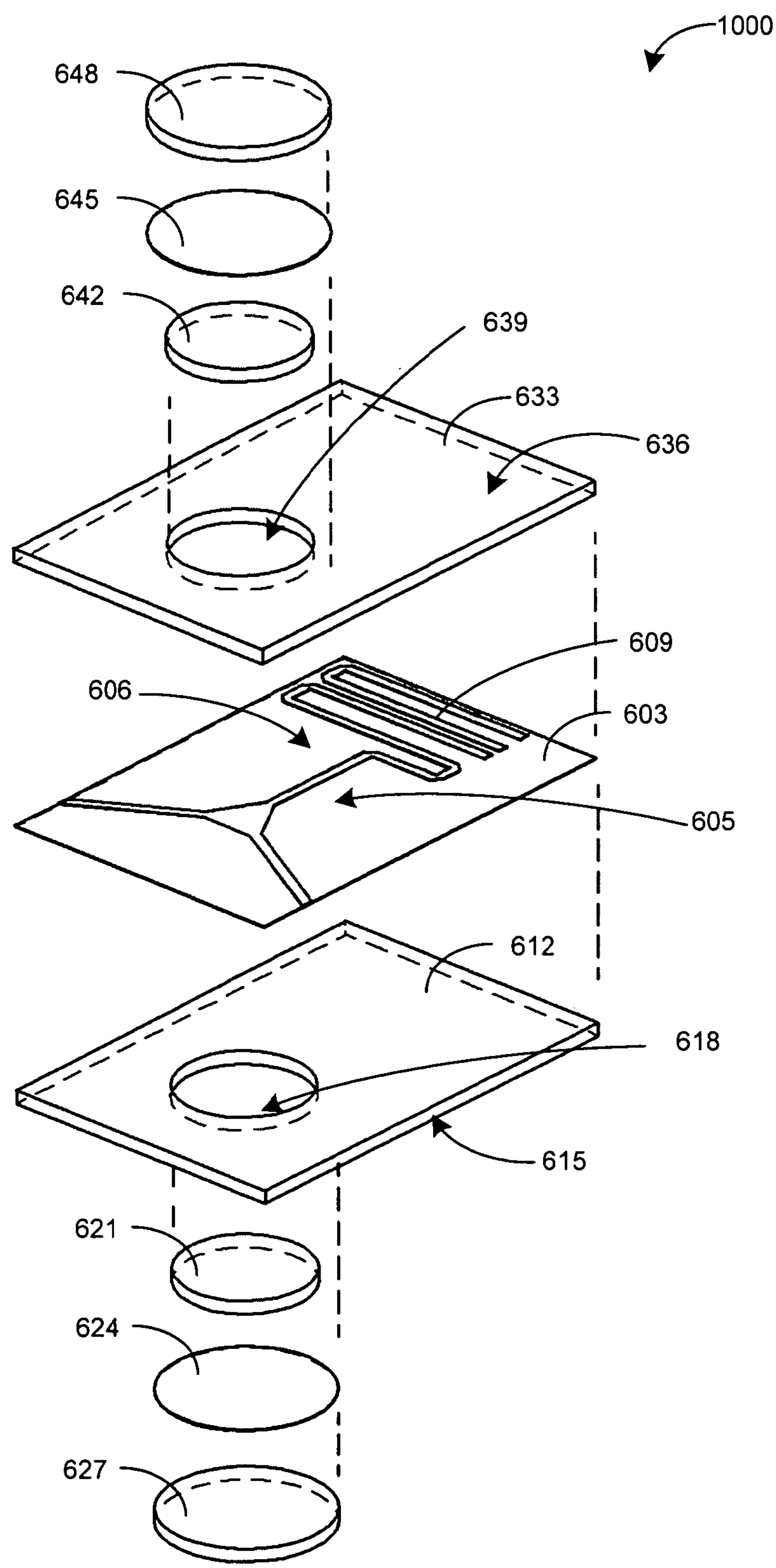
FIG. 10 is an illustration of an exploded view of another embodiment of a circulator assembly integrated with in a stripline circuit assembly in accordance with some embodiments of the present invention.

FIG. 10 is an illustration of another exemplary embodiment of a stripline circuit assembly 1000 containing a circulator assembly integrated with at least on other RF component in accordance with some embodiments of the present invention. The stripline circuit 1000 is identical to the stripline circuit 600 shown in FIG. 6, except the yoke 654 has been eliminated from the circulator assembly 500.

Figure 11:
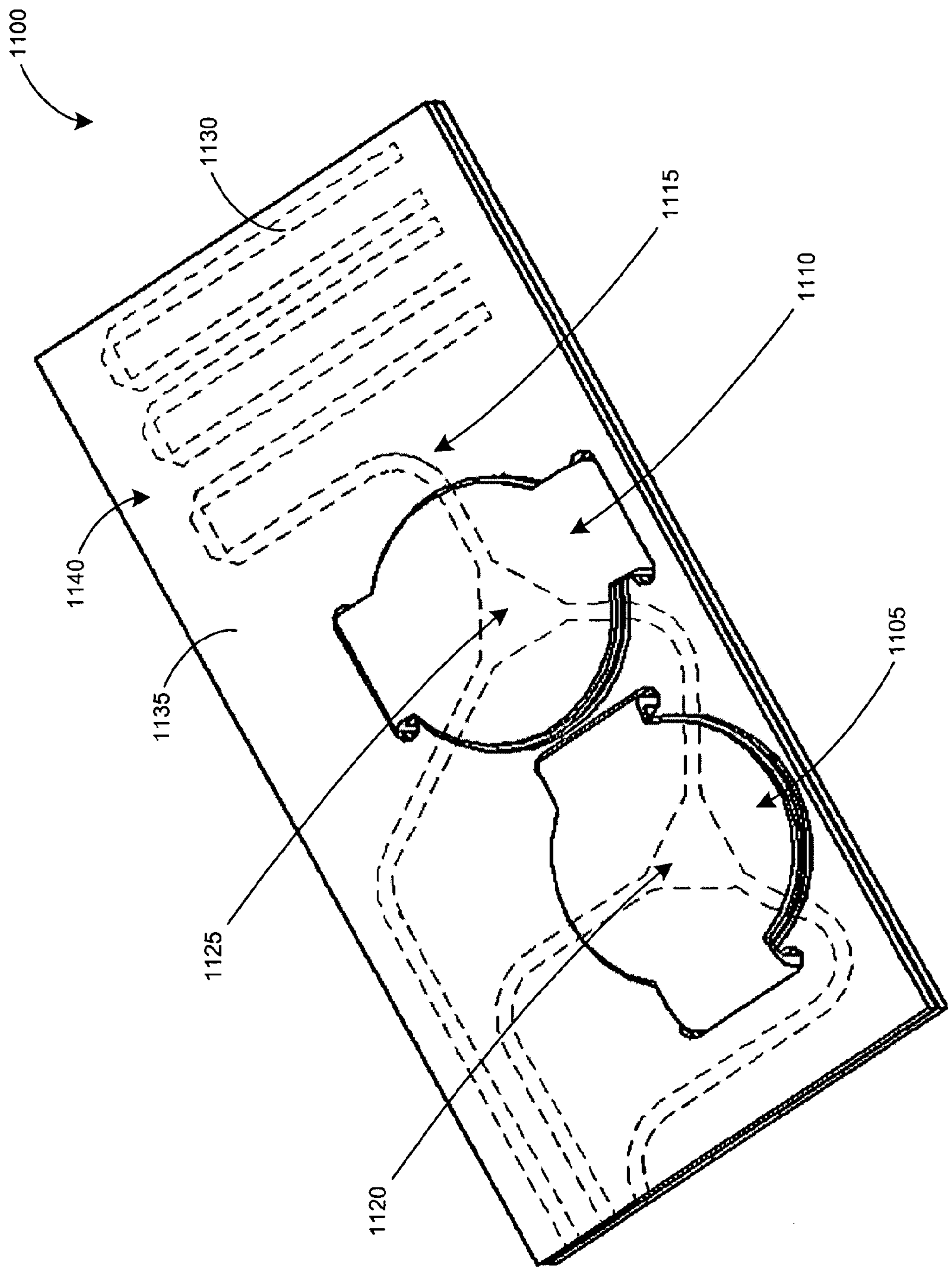
FIG. 11 is an illustration of an overhead view of a stripline circuit assembly containing two integrated circulator assemblies in accordance with some embodiments of the present invention.

Although the stripline circuit has been shown to have a single circulator element integrated into the circuit trace 606, those skilled in the art will appreciate that the stripline circuit assembly 600 can contain any number of circulator assemblies integrated within the circuit trace. FIG. 11 in an illustration of another exemplary stripline circuit 1100 that contains two circulator assemblies 1110 and 1115 that have a circulator circuit trace 1120 and 1125, respectively connected in series, which are integrated within a continuous circuit trace 1115 containing at least one other electronic element 1030 in accordance with the present invention. As seen by the figure, the circulator circuit traces 1120 and 1125 are connected through a common circuit trace 1115 to the RF component 1130 without using interconnects. Furthermore, the circulator assemblies 1105 and 1110 share a common ground plane with the RF component 1130, where the common ground plane 1130 extending over the entire continuous circuit trace 1115.

Figure 12:
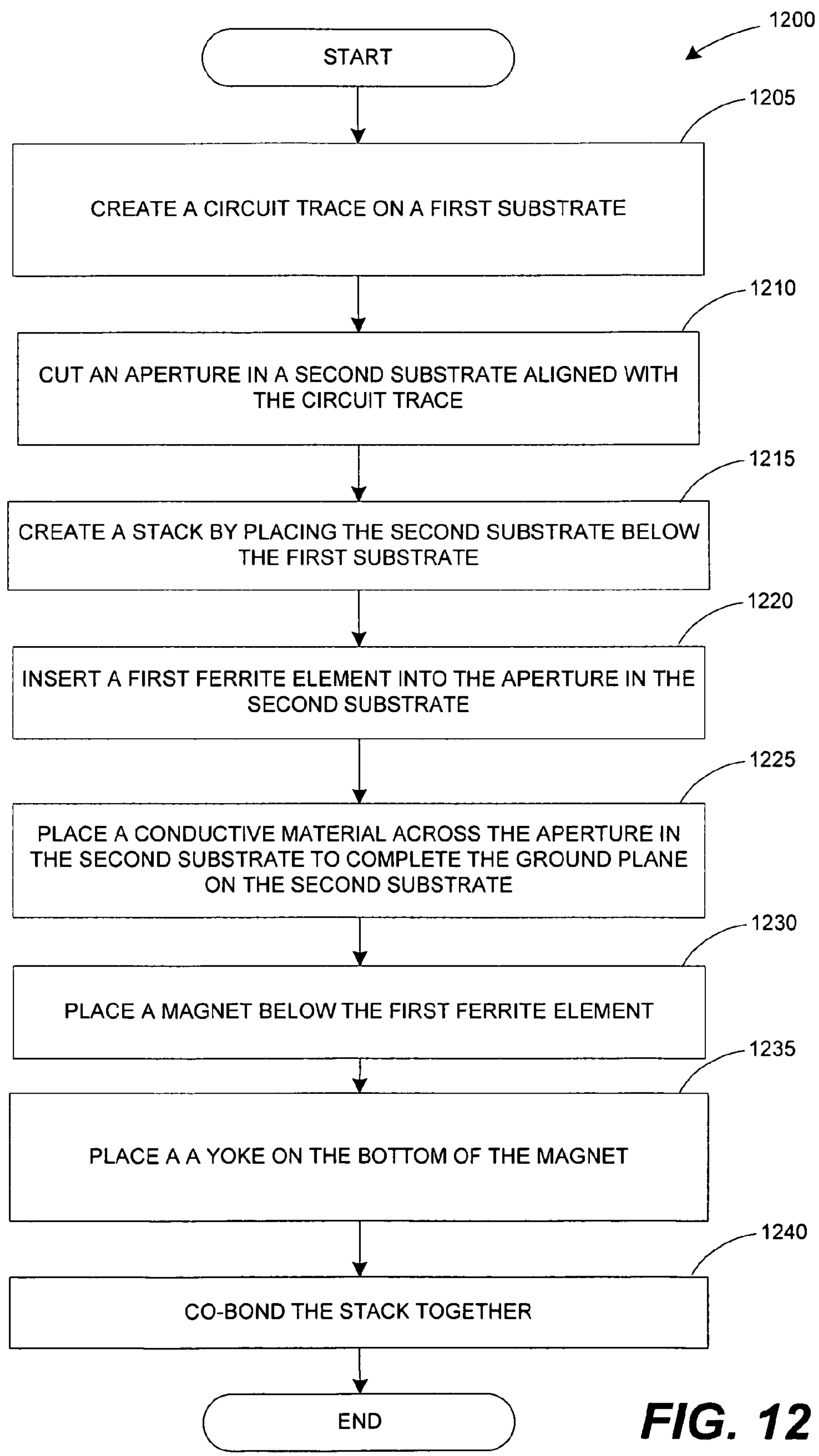
FIG. 12 is a logic flow diagram illustrating a method for manufacturing a circulator assembly in accordance with some embodiments of the present invention.

FIG. 12 is a flow diagram illustrating a process 1200 for manufacturing the circulator assembly 100 in accordance with some embodiment of the present invention. The process 1200 allows the large scale manufacturing of highly reliable and inexpensive circulator assemblies 100 by using readily available low cost materials and eliminating the need for manually assembling the microstrip circulator assemblies 100. Although the process 1200 is described for manufacturing a microstrip circulator assembly 100, those skilled in the art will appreciate that the process 1200 is also applicable for manufacturing a stripline circulator 500 (FIG. 5) in accordance the present invention. Furthermore, those skilled in the art will appreciate that the method 1200 is equally applicable for manufacturing the microstrip circuits 200 (FIG. 2) and stripline circuits 600 (FIG. 6) that include integrated circulator assemblies.

Process 1200 begins at 1205, in which a circuit trace 110 is created on a first substrate 105, wherein the continuous circuit trace contains least one circulator circuit trace 110. The first substrate 105 is made from a non-ferrous dielectric material, such as dielectric materials used for manufacturing PCBs. For instance, the first substrate 105 maybe made from PTFE, or a PTFE combined with glass, glass fibers, resin, ceramics, and the like. Typically, the first substrate 105 that carries the continuous circuit trace 110 is relatively thin. For instance, in an exemplary embodiment, the first substrate 105 has a thickness, $T_1$, in the range of approximately 0.003 inches and 0.007 inches and more preferably of approximately 0.005 inches.

The continuous circuit trace 110 may be deposited on the first substrate 105 using any conventional method known in the art. For example, the continuous circuit trace 110 may be deposited on the first substrate 105 by physical vapor deposition, also known as sputtering, chemical vapor deposition, electro deposition, lamination, and the like. Alternatively, one side of the first substrate 105 can contain cladding one side and the continuous circuit trace 110 can be etched using standard techniques. Designing the continuous circuit trace 110 provides several advantages over the circulator components used in conventional circulators. For instance, since the continuous circuit trace 110 resides on non-ferrous dielectric substrate, the continuous trace 110 of the circulator assembly 100 can be manufactured using conventional PCB techniques. Second, the non-ferrous dielectric is more durable than the ferrous substrates used in conventional circulators. Conventional ferrous substrates are typically made from ferrite or pressed from metallic powder, which tends to be brittle, easily broken, limited in size, expensive, and usually is not compatible with other RF components. Therefore, the use of materials commonly used for PCBs for the first substrate makes the circulator assembly 100 more robust than conventional circulators and therefore, is conducive to automated manufacturing.

At 1210, an aperture 125 is cut into the second substrate 120 at a position that will allow it to be proximately aligned with the circuit trace 110 when the second substrate 120 is bonded to the first substrate 105. The aperture 125 is bored completely through the second substrate 120 and the cladding 130. This "through-boring" process has several advantages over existing circulators. The aperture 125 avoids the problems associated with milling a recess in the substrate to small and precise tolerances, which are difficult to achieve, problematic, and expensive to manufacture.

At 1215, a stack is created by placing a second substrate 120 comprising a cladding layer 130 on at least one side below the first substrate 105. An adhesive material, such as bond film that is suitable for RF circuits is placed between the first substrate 105 and the second substrate 120. The second substrate 120 is also constructed from a non-ferrous dielectric material used for making PCBs. Typically, the second substrate 120 is made from the same material and has the same dielectric constant as the first substrate 105. However, those skilled in the art will appreciate that the second substrate 120 may be made from a different material and have a different dielectric constant than the first substrate 105. Furthermore, the second substrate 120 is made to have thickness, $T_2$ that is greater than the thickness of the first substrate 105. In one exemplary embodiment, the thickness $T_2$, of the second substrate 120 is between approximately 0.01 inches and 0.07 inches, and more preferably about 0.03 inches. At this time the stack, which consists of the first substrate 105 and the second substrate 120 may be bonded tighter to form a circuit board laminate. Alternatively, the bonding process may be performed after all of the elements have been aligned and assembled.

The second substrate 120 contains an aperture 125 that is proximately aligned with the circuit trace 110 on the first substrate 105. The aperture 125 is typically circular in shape and has a diameter that encompasses the entire central resonator portion of the circulator circuit trace 110. A circular-shaped aperture 125 is preferred over other shapes, as a circular-shaped aperture 125 is easier and less expensive to manufacture than other shaped aperture. Although a circular-shaped aperture 125 is described as being more desirable, the aperture 125 may have any polygonal shape, such as a triangle, a square, a pentagon, a hexagon, a heptagon, an octagon, and the like.

At 1220, a ferrite element 135 is placed within the aperture 125 in the second substrate 120. The ferrite element 135 is typically formed in the shape of a disc, and has a thickness that is substantially equal to the thickness, $T_2$, of the second substrate 120. This allows the top of the ferrite element 135 to be coplanar with the top of the second substrate 120 and the bottom of the ferrite element 135 to be coplanar with the cladding 130 on the bottom of the second substrate 120. This prevents any discontinuities from forming within the circuit trace 110 due to unwanted flexing. The use of pre-drilled apertures 125 in the second substrate 120, which are proximately aligned with the circulator component 115, allows the ferrite element 135 to be "self aligning." Thus, the ferrite element 135 can be placed in the correct relationship relative to the circulator element 115 without the use of special alignment jigs or structures. Furthermore, since the alignment jigs are not longer required, the process of inserting the ferrite elements 135 can be automated using standard PCB manufacturing techniques.

At 1225, a conductive material 140 is placed across the aperture 125 and over the ferrite element 135 so that it is in electrical contact with the cladding layer 130. The conductive material 140, by being in electrical contact with the cladding 130 completes the ground plane for the circulator 100. Normally, the conductive layer 140 has a thickness in the range of approximately 0.003 inches and 0.007 inches. The thin conductive material provides a substantially planar ground plane, which is continuous across the aperture 125. The conductive layer 140 is typically made from a conductive tape, which not only completes the ground plane, but also supports the ferrite element 135 in the aperture 125 and is thermally stable over the operating temperatures of the circulator 100. Alternatively, the conductive material 140 may be made of a conductive adhesive, such as a two-part epoxy, and the like.

Next, at 1230, a magnet 145 is placed beneath the conductive layer 140 and in proximal alignment with the ferrite element 135. The magnet 145 is typically a permanent magnet and is bonded to the ferrite element with a conductive material 140. Typically, the conductive material is the same conductive tape used for the conductive material 140 disposed between the magnet 145 and the ferrite disc 135. The conductive material 140 may also be made from a conductive adhesive, and the like.

At 1235 a yoke 155 is placed below the magnet 145. A conductive material 140 is also disposed between the magnet 145 and the yoke 155 to allow the yoke 155 to be bonded to the magnet 145.

Finally, at 1240, the stack is laminated in a one-step process, also known as co-bonding. This co-bonding process of manufacturing can be applied to manufacturing at least one circulator with at least one RF component that share a common, continuous circuit trace, in which the various assembly components are laminated or joined together, in a single step, commonly referred to "co-bonded" or "co-bonding."

The method 1200 for manufacturing the circulator assembly 100 provides several advantages over existing methods. First, since the circulator assembly 100 uses standard dielectric materials commonly used in PCBs for the substrates, rather than ferrite substrates, the cost of manufacturing the circulator assembly is greatly reduced. Second, since the ferrite elements 135 are self aligning, the circulator assembly 100 can be assembled without the use of alignment jigs. Therefore, the circulator assembly 100 can be assembled using standard automated PCB manufacturing techniques. Furthermore, the method 1200 supports panel production practices, which allows large scale production of the circulator assemblies, which greatly reduces the overall cost of manufacturing the circulator assembly 100.

Other alternative embodiments will become apparent to those skilled in the art to which an exemplary embodiment pertains without departing from its spirit and scope. Accordingly, the scope of the present invention is defined by the appended claims rather than the foregoing description.

We claim:

1. A circulator assembly comprising:

a first substrate comprising:

a first continuous circuit trace printed on a first side of the first substrate, the first continuous circuit trace comprising a first circulator pattern and a first external component;

a second continuous circuit trace printed on a second side of the first substrate, the second continuous circuit trace comprising at least a second circulator pattern;

wherein the first circulator pattern and the second circulator pattern comprise a central conductor element and three or more connection ports;

a second substrate disposed below the first substrate, comprising:

a cladding on at least one side;

an aperture; and a ferrite element inserted into the aperture and proximately aligned with the central conductor elements;

a conductive material disposed over the ferrite element of the second substrate and in electrical contact with the cladding of the second substrate forming a continuous ground plane; and a first magnet positioned below the ferrite element.

2. The device of claim 1, wherein the first circulator pattern further comprises a discontinuous ring disposed around the central conductor element to improve circulator loading.

3. The device of claim 1, wherein the central conductor element comprises one or more slots, one or more tabs, or both to improve circulator loading.

4. The device of claim 1, wherein the thickness of the first substrate is between approximately 0.001 and 0.010 inches.

5. The device of claim 1, further comprising a second external component in a continuous circuit trace with the first circulator pattern and the first external component.

6. The device of claim 1, wherein the first external component comprises an RF electronic component.

7. The device of claim 6, wherein the RF electronic component comprises one of a second circulator pattern, a filter, an antenna, a power divider, and a power combiner.

8. A device comprising:

a first substrate;

a first continuous circuit trace printed on the first side of the first substrate, the first continuous circuit trace comprising a first circulator pattern and a first external component;

a second continuous circuit trace printed on the second side of the first substrate, the second continuous circuit trace comprising at least a second circulator pattern; wherein the first and second circulators each comprise a central conductor element and three or more connection ports;

a second substrate disposed beneath the first substrate, comprising:

a cladding on a first side;

a first aperture; and a first ferrite element inserted into the first aperture and proximately aligned with the central conductor elements;

a conductive material disposed over the first ferrite element and in electrical contact with the cladding on the first side of the second substrate to form a continuous ground plane; and a first magnet disposed below the first ferrite element.

9. The device of claim 8, wherein the first circulator and the second circulator are connected with conductive vias in the first substrate.

10. The device of claim 8, wherein the thickness of the first substrate is between approximately 0.001 and 0.010 inches.

11. The device of claim 8, wherein the second continuous circuit trace printed on the second side of the first substrate comprises the second circulator pattern and a second external component.

12. The device of claim 8, wherein the thickness of the second substrate is between approximately 0.01 and 0.07 inches.

13. The device of claim 8, wherein the conductive material comprises a conductive thin film adhesive.

* * * * *